United States Patent
Frank et al.

(10) Patent No.: US 9,291,365 B2
(45) Date of Patent: Mar. 22, 2016

(54) SOLAR CONCENTRATOR ASSEMBLY AND METHODS OF USING SAME

(75) Inventors: Scot G. Frank, Holladay, UT (US); Catlin Powers, San Jose, CA (US); Amy Qian, San Jose, CA (US); Orian Z. Welling, Custer, WI (US); Brad Simpson, Cottage Grove, OR (US); Reja Amatya, Cambridge, MA (US); Rajeev Ram, Arlington, MA (US)

(73) Assignee: One Earth Designs Inc., Cambridge, MA (US)

( * ) Notice: Subject to any disclaimer, the term of this patent is extended or adjusted under 35 U.S.C. 154(b) by 755 days.

(21) Appl. No.: 13/521,565

(22) PCT Filed: Jan. 12, 2011

(86) PCT No.: PCT/US2011/020986
§ 371 (c)(1),
(2), (4) Date: Oct. 9, 2012

(87) PCT Pub. No.: WO2011/088121
PCT Pub. Date: Jul. 21, 2011

(65) Prior Publication Data
US 2013/0019916 A1    Jan. 24, 2013

Related U.S. Application Data

(60) Provisional application No. 61/294,352, filed on Jan. 12, 2010.

(51) Int. Cl.
*F24J 2/12* (2006.01)
*F24J 2/02* (2006.01)
(Continued)

(52) U.S. Cl.
CPC .... *F24J 2/02* (2013.01); *F24J 2/07* (2013.01); *F24J 2/12* (2013.01); *F24J 2/42* (2013.01);
(Continued)

(58) Field of Classification Search
CPC ................... F24J 2/02; F24J 2/12; F24J 2/38; H01L 35/30
USPC .......... 126/680, 451, 438, 270, 608; 136/206, 136/201, 246
See application file for complete search history.

(56) References Cited

U.S. PATENT DOCUMENTS 3,643,648 A * 2/1972 Tarcici ........................ 126/627
4,112,917 A * 9/1978 Lang ........................... 126/608
(Continued)

FOREIGN PATENT DOCUMENTS

JP  2000-031522 A  1/2000
JP  2003-329310 A  11/2003
(Continued)

OTHER PUBLICATIONS

JP2003329310(A) Takizawa Honshiyunl, Solar Heat Cooker, Nov. 19, 2003.*
(Continued)

*Primary Examiner* — Gregory Huson
*Assistant Examiner* — Nikhil Mashruwala
(74) *Attorney, Agent, or Firm* — Goodwin Procter LLP

(57) ABSTRACT

A solar concentrator assembly includes a tripod, a base, a reflective dish, a receptacle, and a thermoelectric module or a heat transfer module. The tripod includes legs and a top tripod connector coupled to top portions thereof. The base includes a rod coupled to the tripod; a bottom support structure coupled to the rod; a top support structure coupled to the bottom support structure; an extension coupled to the bottom support structure and the top support structure; and a cap with recesses mounted to the top support structure. The reflective dish includes support rods received within the recesses; a pliable material forms panels, wherein the support rods are inserted into seams between the panels; and a reflective material disposed on the pliable material. The receptacle is connected to the base and disposed within the reflective dish. The thermoelectric module or the heat transfer module is partially disposed within the receptacle.

9 Claims, 38 Drawing Sheets

(51) Int. Cl.
*F24J 2/07* (2006.01)
*F24J 2/42* (2006.01)
*F24J 2/44* (2006.01)
*F24J 2/52* (2006.01)
*H01L 35/30* (2006.01)
*F24J 2/05* (2006.01)

(52) U.S. Cl.
CPC .. *F24J 2/44* (2013.01); *F24J 2/523* (2013.01); *H01L 35/30* (2013.01); *F24J 2/05* (2013.01); *F24J 2002/5277* (2013.01); *Y02E 10/41* (2013.01); *Y02E 10/42* (2013.01); *Y02E 10/47* (2013.01)

(56) References Cited

U.S. PATENT DOCUMENTS

| | | | | |
|---|---|---|---|---|
| D263,785 S | * | 4/1982 | Phillips | D7/324 |
| 4,457,297 A | * | 7/1984 | Sobczak et al. | 126/605 |
| 4,587,952 A | | 5/1986 | Richardson | |
| 4,696,285 A | * | 9/1987 | Zwach | 126/604 |
| 5,617,843 A | * | 4/1997 | Erwin | 126/681 |
| 6,863,065 B2 | * | 3/2005 | Marut et al. | 126/681 |
| 2006/0225729 A1 | | 10/2006 | Litwin | |
| 2013/0042903 A1 | * | 2/2013 | Henry | F24J 2/10 136/248 |
| 2015/0055237 A1 | * | 2/2015 | Chan | F24J 2/1047 359/853 |

FOREIGN PATENT DOCUMENTS

| | | |
|---|---|---|
| KR | 20-1983-0002041 | 11/1983 |
| KR | 10-0879433 B1 | 1/2009 |
| WO | WO-2011-088121 A2 | 7/2011 |

OTHER PUBLICATIONS

International Search Report and Written Opinion for PCT/US2013/031971, mailed Jun. 28, 2013 (13 pages).
International Search Report and Written Opinion for PCT/US2011/020986, mailed Oct. 18, 2011.

* cited by examiner

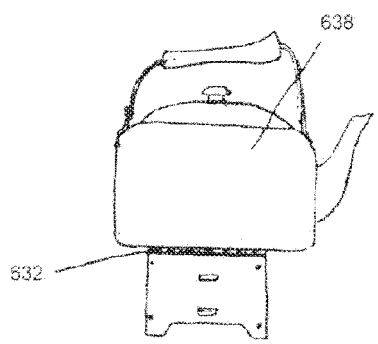
FIG. 26
FIG. 27
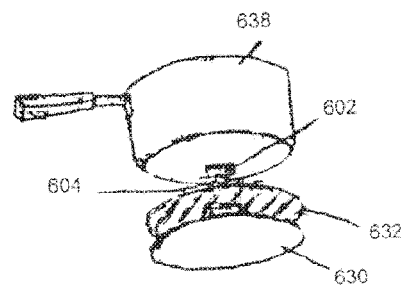
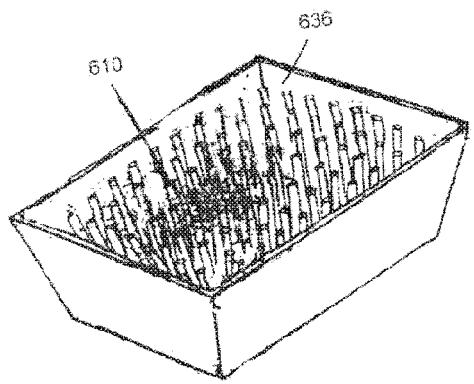
FIG. 28

US 9,291,365 B2

SOLAR CONCENTRATOR ASSEMBLY AND METHODS OF USING SAME

CROSS-REFERENCE TO RELATED APPLICATION

This application is a national stage entry of International Patent Application No. PCT/US2011/020986, filed Jan. 12, 2011, which claims priority to and the benefit of, and incorporates herein by reference in its entirety, U.S. Provisional Patent Application No. 61/294,352, which was filed on Jan. 12, 2010.

FIELD OF THE INVENTION

This invention relates generally to portable and collapsible solar concentrator assemblies that can be used for multiple, interchangeable purposes, such as for generating heat or electricity.

BACKGROUND

People in rural areas may not have ready access to electricity or heat for basic needs, such as for boiling water and staying warm. For instance, in developing nations or indigent areas, access to electricity or heat sources may be limited or nonexistent. Areas with access to abundant solar energy, such as high-altitude, rural areas (e.g., in the Himalayas or Andes), or deserts (Gobi, Sahara, Taklimakan, Sonoran, Mojave, Kalahari, or Atacama), may be able to harness solar energy to provide for these basic needs. Similarly, developed nations can offer suitable environments as well.

Current devices that gather and collect solar energy often use that energy for single-use purposes, such as for either cooking or heating. Such devices merely concentrate or collect solar energy and, therefore, are limited to applications that utilize concentrated or collected solar energy. Furthermore, current devices may not be readily or easily portable. Portability can be desirable for the aforementioned areas, inter alia, due to potentially harsh climates.

Accordingly, a solar energy system is needed that allows for a portable and collapsible assembly for easy transport. The components of the system should be cost-effective and lightweight. The system should also be easy to assemble and disassemble. Furthermore, a system that converts the solar energy to other forms may be used for multiple purposes. The system should also allow components for various purposes to be interchangeable without the need for complex assembly or disassembly.

SUMMARY OF THE INVENTION

In general, in one aspect, the invention relates to a portable solar concentrator assembly having a tripod that includes a plurality of legs and a top tripod connector coupled to top portions of the plurality of legs, such that the top tripod connector forms an aperture therethrough. The assembly includes a base coupled to the tripod, the base having a rod coupling the base to the tripod, such that the rod can be received in the aperture of the top tripod connector; a bottom support structure coupled to a top end of the rod; a top support structure pivotably coupled to the bottom support structure; an extension coupled to the bottom support structure and the top support structure, the extension having a handle portion and a distal portion opposite the handle portion; and a cap with a plurality of recesses mounted to the top support structure. The assembly includes a reflective dish removably attached to the base, such that operation of the base rotates the reflective dish along all possible arbitrary trajectories. The reflective dish includes a plurality of dish support rods detachably received within the plurality of recesses, a pliable material forming a plurality of panels, such that each of the plurality of dish support rods is inserted into seams between each of the plurality of panels, and a reflective material disposed on the pliable material. The assembly also includes a receptacle connected to the base and disposed within the reflective dish, and at least one of a thermoelectric module and a heat transfer module at least partially disposed within the receptacle, such that solar energy is directed to the thermoelectric module to generate electricity and to the heat transfer module to generate and to circulate heat.

This aspect can have any of the following features or embodiments. The tripod can be collapsible. The reflector dish can be collapsible. The plurality of dish support rods can be connected together by a cable. A portion of each of the plurality of dish support rods may not be covered by the plurality of panels. The reflective material can be light and flexible. The reflective material can be one of aluminized plastic polymer, mylar, polyethylene terephylalate, recycled chip bags, reflective food packaging, metal foil, aluminum foil, or a matrix of small mirrors. The reflective material can be sewn or glued to the pliable material. The plurality of panels can be sewn together. The reflective material can be covered with cloth, a tarp, or a screen to prevent damage or soiling when not in use, when in transit, or during storage.

In another embodiment of any of the foregoing aspect or features, the assembly includes a compression plate operatively coupled to the cap via a threaded crank that connects the compression plate to the cap, such that adjustment of the threaded crank tightens the cap and the compression plate together to tension the plurality of dish support rods such that the reflective dish forms a substantially paraboloid shape when assembled.

In yet another embodiment of any of the foregoing aspect or features, the thermoelectric module comprises at least one thermopile having a top side and a bottom side. Moreover, the aforementioned aspect or embodiments can have any of the following features or embodiments. The solar energy can be directed to the bottom side of the at least one thermopile. The top side of the at least one thermopile can be cooled relative to the bottom side.

In a further embodiment of any of the foregoing aspect or features, the assembly includes a heat sink mounted on the top side of the at least one thermopile. In an additional embodiment of any of the foregoing aspect or features, the assembly includes a water-retaining vessel mounted on the top side of the at least one thermopile. Furthermore, the aforementioned aspect or embodiments can have any of the following features or embodiments. The heat sink can be disposed in the water-retaining vessel. The water-retaining vessel can be a cooking vessel. The cooking vessel can be one of a kettle, pot, and pan.

In still another embodiment of the foregoing aspect or features, the heat transfer module includes a heating coil disposed within the receptacle, such that the heating coil housing a heat transfer fluid, and a heat dissipater connected to the heating coil, such that the heat transfer fluid can flow between the heating coil and the heat dissipater. The aforementioned aspect or embodiments can have any of the following features or embodiments. A portion of the heat transfer module can be located outside of the receptacle. The heat dissipater can be at least one of an array of tubes, a small tank, and an array of tubes and a small tank. A portion of the heat dissipater can be elevated higher than the heating coil. The heat heat transfer fluid can be water and alcohol, antifreeze, cooking oil, or other locally-produced oil.

These and other objects, along with advantages and features of the present invention herein disclosed, will become apparent through reference to the following description, the accompanying drawings, and the claims. Furthermore, it is to be understood that the features of the various embodiments described herein are not mutually exclusive and can exist in various combinations and permutations.

BRIEF DESCRIPTION OF THE FIGURES

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which:

FIG. 26 is a schematic side view of a thermoelectric module in accordance with an embodiment of the invention;

FIG. 27 is a schematic exploded view of a portion of the thermoelectric module in accordance with an embodiment of the invention;

FIG. 28 is a schematic perspective of a heat sink and a water-retaining vessel of a thermoelectric module in accordance with an embodiment of the invention;

DETAILED DESCRIPTION

FIGS. 1 through 4 depict various views of embodiments of a solar concentrator assembly 100. The solar concentrator assembly 100 has various modules. These include a tripod module 200, a base module 300, and a reflective dish module 400. These modules may be manufactured and designed to be lightweight, portable, and easily assembled and disassembled. For example, various components of the modules may be made from lightweight, yet sturdy materials, such as sheet metal (e.g., aluminum), bamboo, plastics, textiles, and/or canvas. Moreover, the tripod module 200 and the reflective dish module 400 may be collapsible or foldable.

Figure 5:
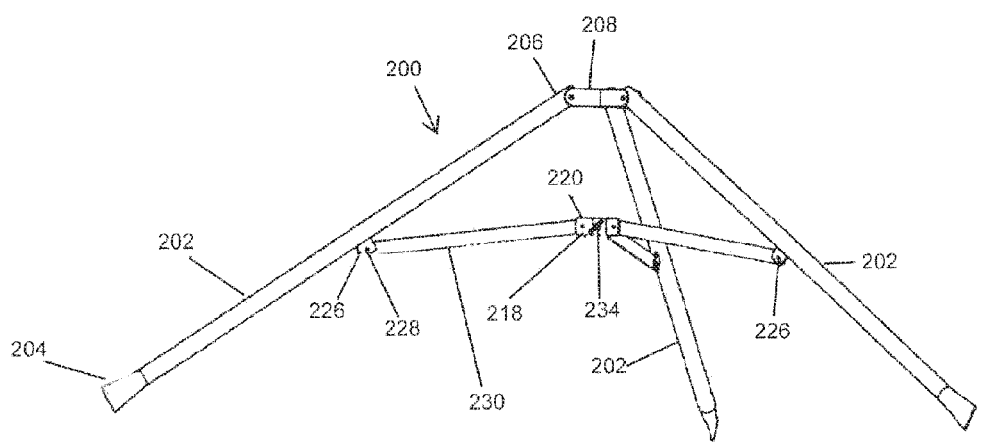
FIG. 5 is a schematic perspective view of the tripod of the solar concentrator assembly in accordance with an embodiment of the invention.
Figure 6:
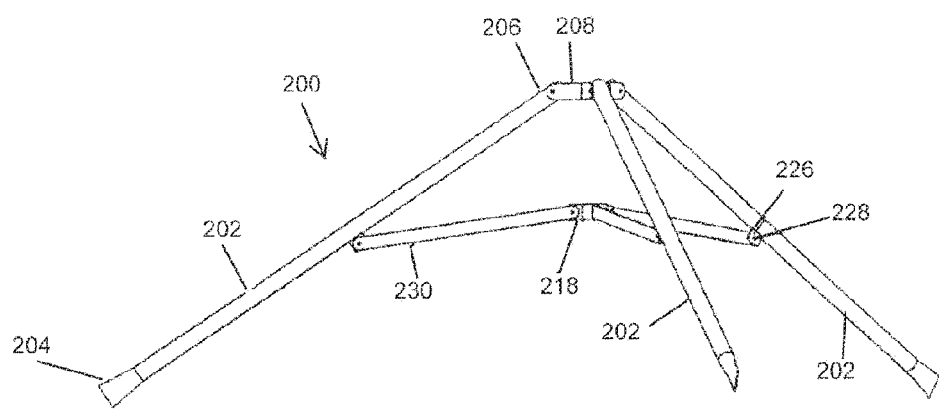
FIG. 6 is another schematic perspective view of the tripod of FIG. 5.

FIGS. 5 and 6 depict various views of an embodiment of the tripod module 200. The tripod module 200 includes a plurality of legs 202, for example, three legs, to provide a stable base. Additionally, the tripod 200 may have more legs than shown. Each of the legs 202 has a ground-engaging end 204 and a top end 206. The ground-engaging end 204 of the legs 202 may be pointed, flattened, or sharpened to allow the tripod 200 and solar concentrator assembly 100 to engage and to grab a hold of the ground. This provides for a stable engagement with the ground while minimizing slippage. Other shapes, sizes, and orientations of the ends are contemplated (e.g., tapered ends, slightly hollow interior with tapered or pointed ends, and pointed steel caps) that allow for the tripod 200 to engage the ground while minimizing slippage in order to provide a stable foundation for the tripod 200 and the solar concentrator assembly 100. Rope loops may also be attached to the legs 202 to allow the tripod and solar concentrator assembly to be staked down. The solar concentrator assembly may also be staked down by driving a stake through a hole in a leg 202.

Figure 7:
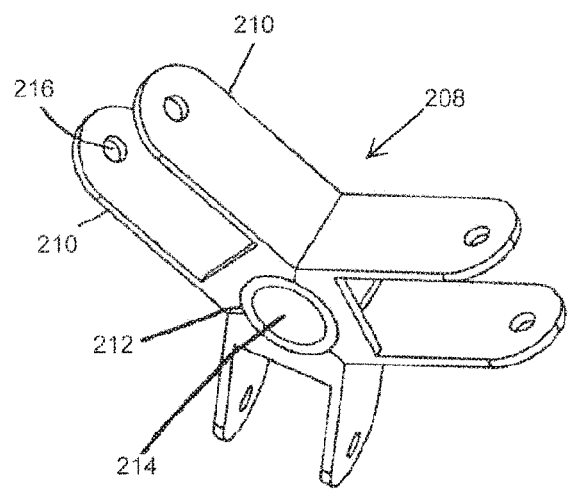
FIG. 7 is a schematic perspective view of the top tripod connector of the tripod of the solar concentrator assembly in accordance with an embodiment of the invention.
Figure 8:
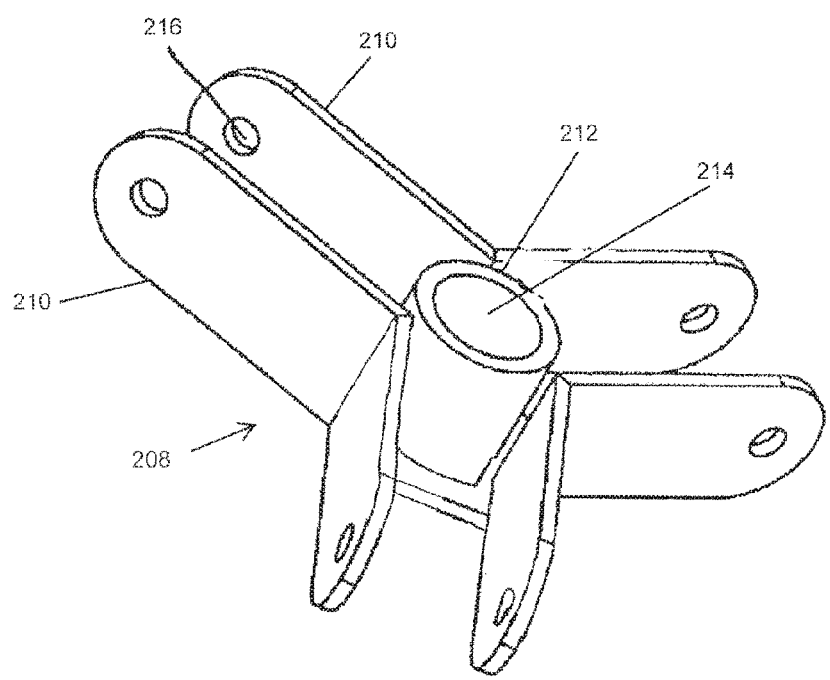
FIG. 8 is another schematic perspective view of the bottom of the top tripod connector of FIG. 7.
Figure 9:
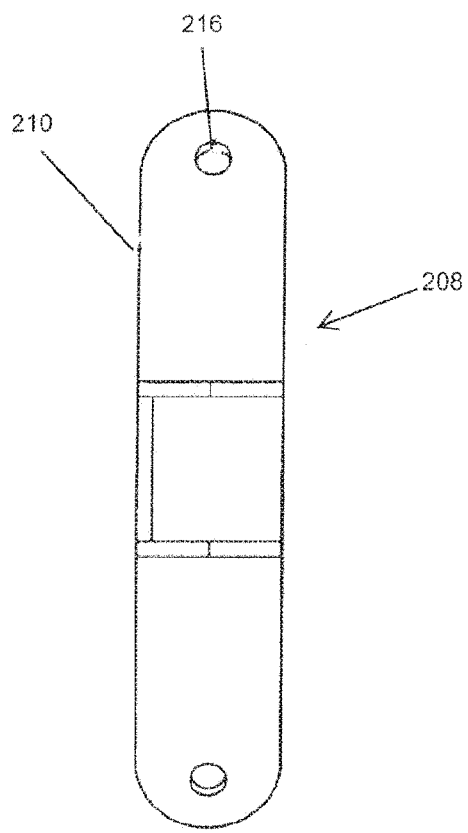
FIG. 9 is a schematic side view of the top tripod connector of FIG. 7.

FIGS. 7 through 9 depict various views of an embodiment of a top tripod connector 208. The top tripod connector 208 connects all of the legs 202 together at their top ends 206. The top tripod connector 208 includes arms 210 extending from a central body 212 with an aperture 214 formed vertically through the central body 212. The number of arms 210 may be twice the number of legs 202. The arms 210 may be paired and sized such that the distance between the arms 210 is substantially the same size, and perhaps slightly larger, than the diameter or width of the top ends 206 of the legs 202. In this manner, the top ends 206 of the legs 202 may fit between the arms 210. The legs 202 may be secured to the arms 210 of the top tripod connector 208 via bolts. Apertures 216 formed in the arms 210 and the legs 202 (not shown) receive the bolts therethrough. The legs 202 are pivotably secured to the arms 210, while bolted, so that the legs 202 may move and allow the assembled tripod 200 to fold or collapse.

Figure 10:
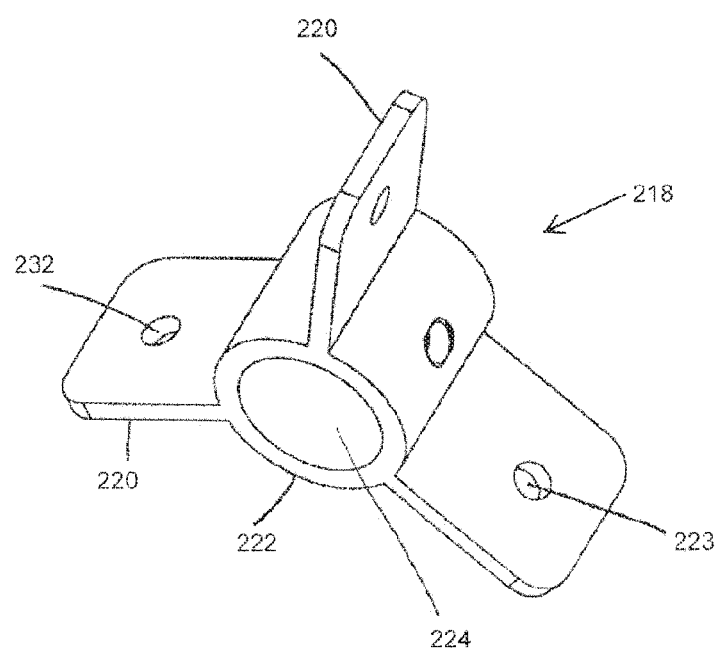
FIG. 10 is a schematic perspective view of the bottom tripod connector of the tripod of the solar concentrator assembly in accordance with an embodiment of the invention.
Figure 11:
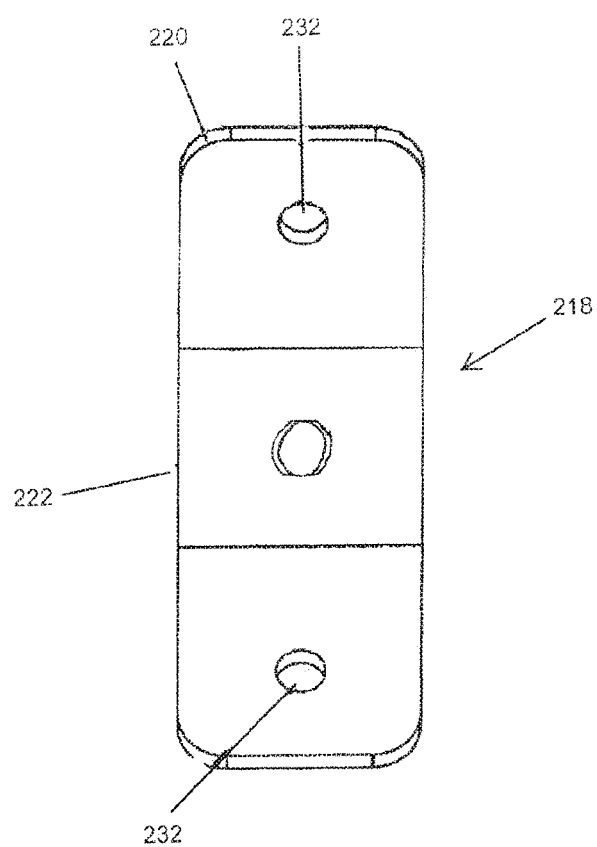
FIG. 11 is a schematic side view of the bottom tripod connector of FIG. 10.

FIGS. 10 through 11 depict various views of an embodiment of a bottom tripod connector 218. The bottom tripod connector 218 includes wings 220, one for each leg 202, extending from a substantially cylindrical body 222 with a hollow portion 224 formed therethrough. Referring back to FIGS. 1, 2, 5, and 6, each leg 202 is connected to a bracket 226. The bracket 226 may be integrally formed with the leg 202, or connected to the leg 202 through various mechanisms, including, but not limited to, welding, gluing, screwing, or bolting. Each bracket 226 includes an aperture 228 to connect to an elongate extension 230. The elongate extension 230 is connected to a wing 220 and a bracket 226, for example, by bolting through apertures 232 on the wings 220 and apertures 228 on the brackets 226. The elongate extension 230 is pivotably connected such that the legs 202 may be collapsed or folded. The elongate extensions 230 may have varying lengths such that the length of the elongate extensions 230 determines how far apart the legs 202 spread. Alternatively, the bottom tripod connector 218 may have a similar shape as and may be correspondingly similarly secured to the legs 202.

In this embodiment, the bottom tripod connector 218 may have dimensions larger or smaller than the top tripod connector 208.

Figure 12:
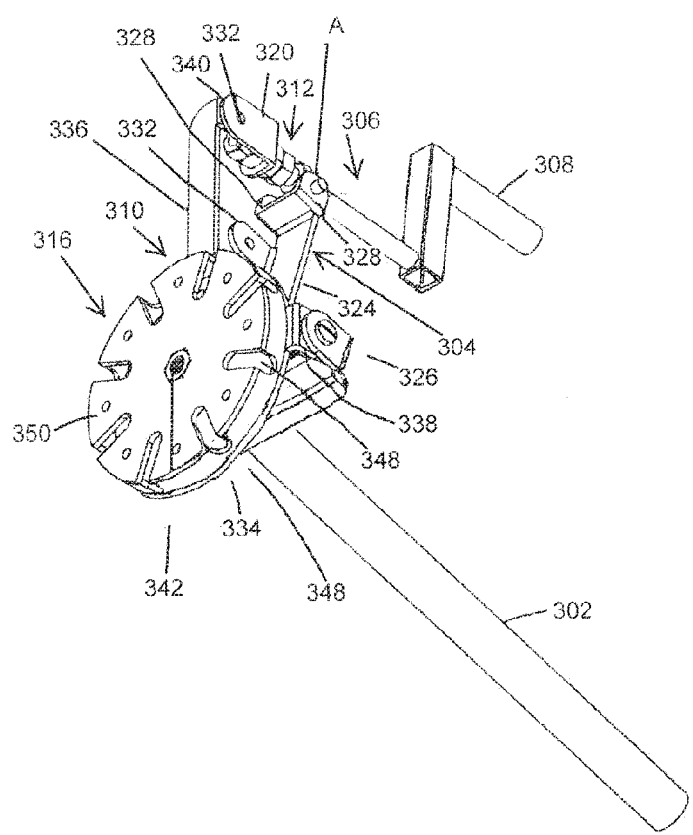
FIG. 12 is a schematic perspective view of a portion of the base of the solar concentrator assembly in accordance with an embodiment of the invention.
Figure 13:
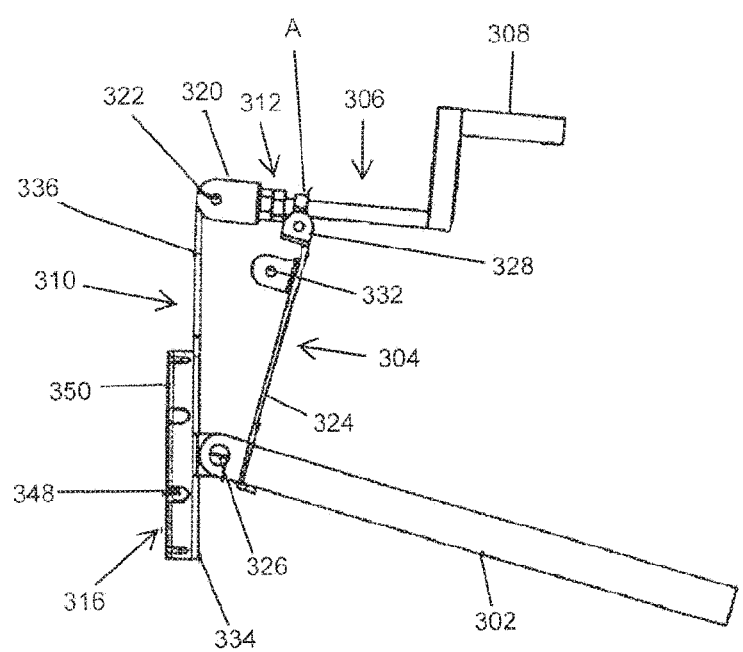
FIG. 13 is a schematic side view of the portion of the base of FIG. 12.

FIGS. 12 through 13 depict various views of an embodiment of a base module 300. The base module 300 includes a rod 302 connected to one end of a base assembly bottom support structure 304. The rod 302 may be integrally formed with the bottom support structure 304 or the rod 302 may be fixed securely to the bottom support structure 304 through various means, including with epoxy, welding, adhesive, screws, etc. The rod 302 and bottom support structure 304 may be fixed together such that they move together. Alternatively, the rod 302 and bottom support structure 304 may be pivotably connected to one another. The end opposite the rod-connecting end of the bottom support structure 304 is connected to an extension 306, which may be, for example, a leadscrew. The extension 306 includes a handle 308 at one end. The bottom support structure 304 may be connected to the extension 306 at any point near the end distal to the handle 308. The bottom support structure 304 may be fixed to the extension 306. Alternatively, the bottom support structure 304 is pivotably connected (e.g., via a bolt) to the extension 306. In another alternative embodiment, the rod 302 may be inserted in a short length of pipe that is welded or connected to the bottom support structure 304. Such a degree of freedom could then be fixed using a set screw or clamp. A base assembly top support structure 310 is connected near the end distal to the handle 308 end of the extension 306. The opposite end of the top support structure 310 is pivotably mounted on top of the bottom support structure 310. The top support structure 310 may be mounted (e.g., via bolts or screws) on top of the bottom support structure 304 where the rod 302 is located. The extension 306 may include the handle 308 and a hand cranked threaded screw 312. Operation of the handle 308, such as clock-wise or counterclock-wise movement, will lengthen or shorten the extension 306. Lengthening or shortening the extension 306 tilts the top support structure 310 relative to the bottom support structure 304. A cap 316 is mounted on top of the top support structure 310. In an embodiment, the cap 316 may be screwed, bolted, or attached through various fixed means to the top support structure 310.

Figure 14:
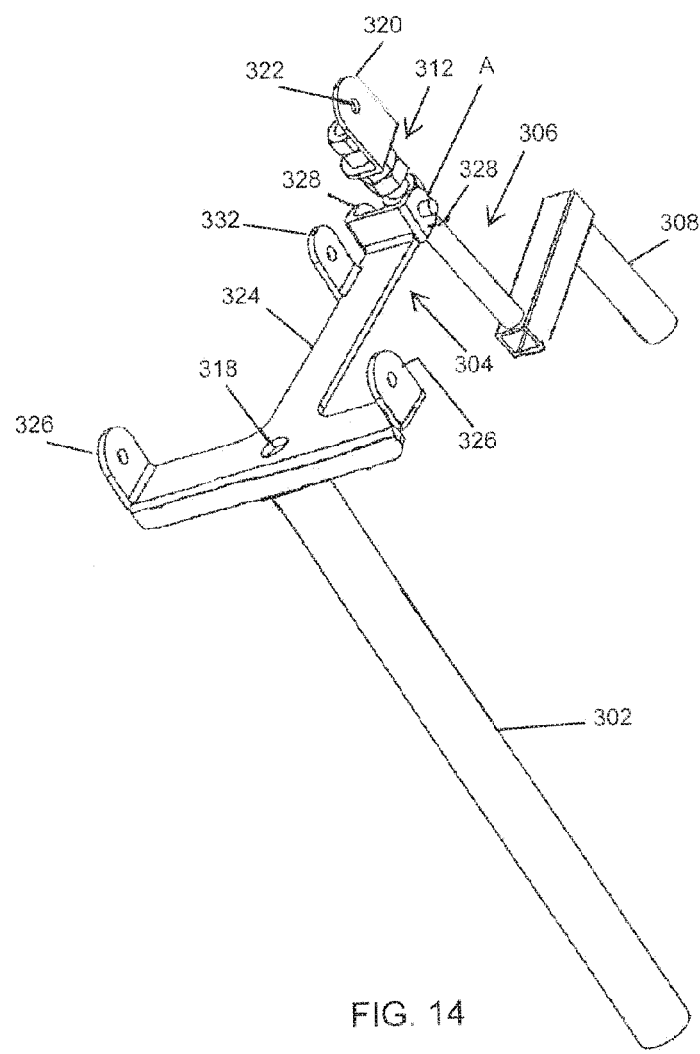
FIG. 14 is a schematic perspective view of a portion of the base of the solar concentrator assembly, including the extension, bottom support structure, and rod, in accordance with an embodiment of the invention.
Figure 15:
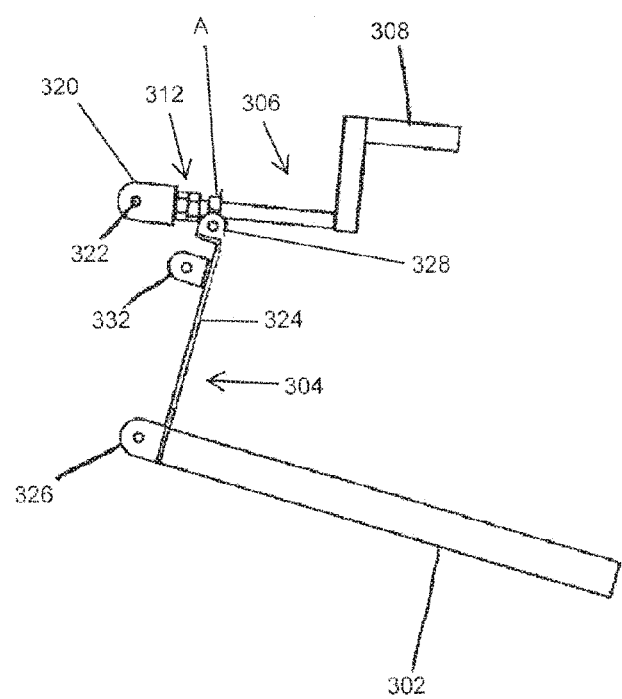
FIG. 15 is a schematic side view of the extension, bottom support structure, and rod of FIG. 14.

FIGS. 14 and 15 depict various views of the rod 302 connected to the bottom of the top support structure 310, which is connected to the extension 308. Further, as described hereinabove, the rod 302 is attached to the bottom support structure 304. As shown in FIG. 14, the bottom support structure 304 may include a hole 318 so that the rod 302 may be attached to the bottom support structure 304, for example, with a screw, bolt, or nut. A cross-section of the rod may correspond in shape to the aperture 214 of the central body 212 of the top tripod connector 208 and the hollow portion 224 of the cylindrical body 222 of the bottom tripod connector 218. For example, the shape of the rod 302 may be substantially cylindrical. The extension 306 may be connected to the bottom support structure 304 at point A through various means, including by pin, bolt, or screw. The handle 308 of the extension 306 may have a linear or non-linear shape. For example, the handle 308 may have a substantially S-shaped configuration so that a user may leverage the handle 308 for operation. The portion of the extension 306 distal to the handle, past point A, may be a threaded screw 312. Additionally, point A of the extension 306 is fixed relative to the bottom support structure 304, such that point A does not move during operation of the handle 308. An elongate bracket 320 is attached near and past the end of the extension 306 distal the handle 308 end. The elongate bracket 320 includes an aperture 322 to connect (e.g., with a bolt or screw) to the top support structure 310.

Figure 1:
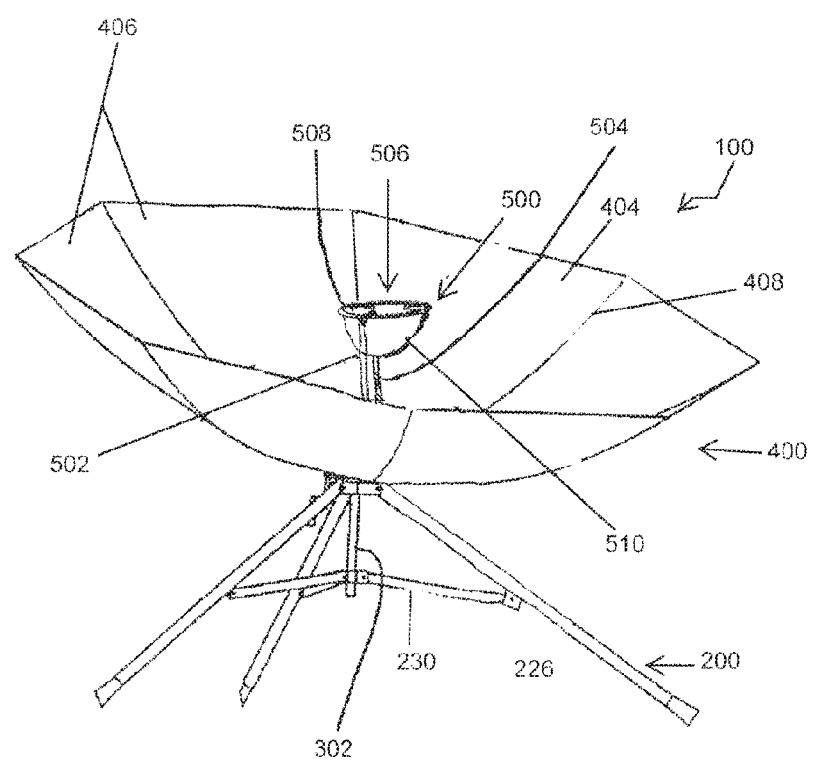
FIG. 1 is a schematic perspective view of a solar concentrator assembly in accordance with one embodiment of the invention.
Figure 2:
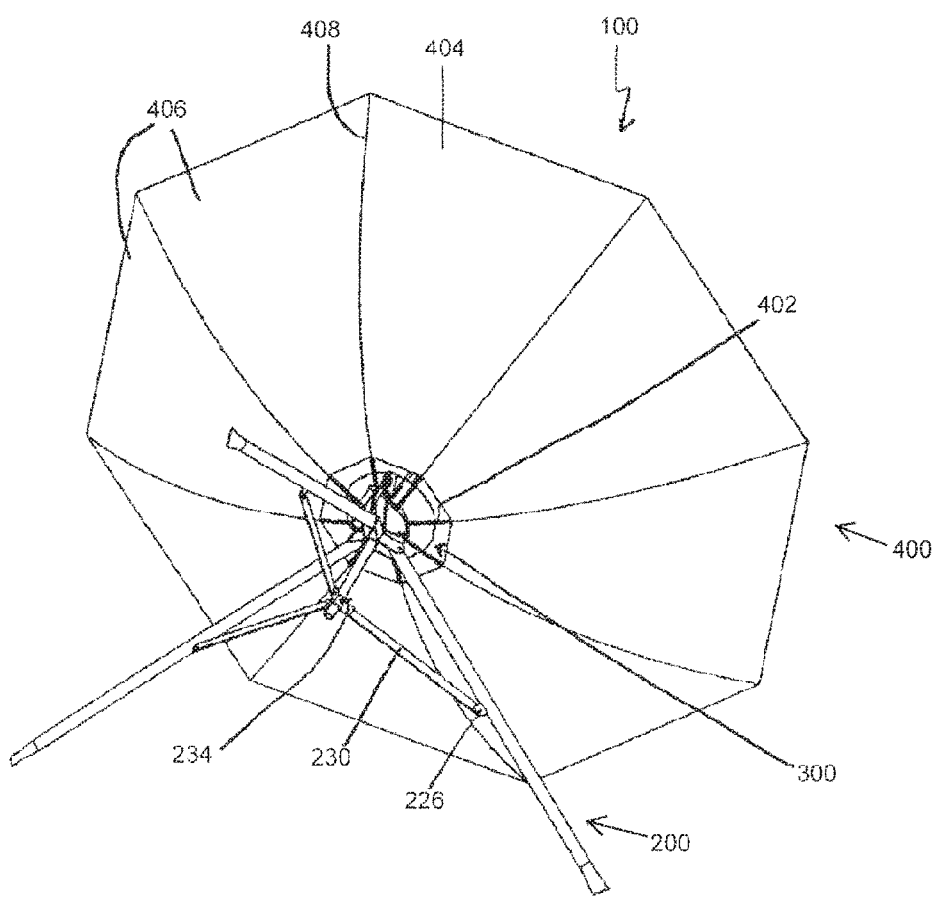
FIG. 2 is schematic perspective view of the bottom of the solar concentrator assembly of FIG. 1.
Figure 3:
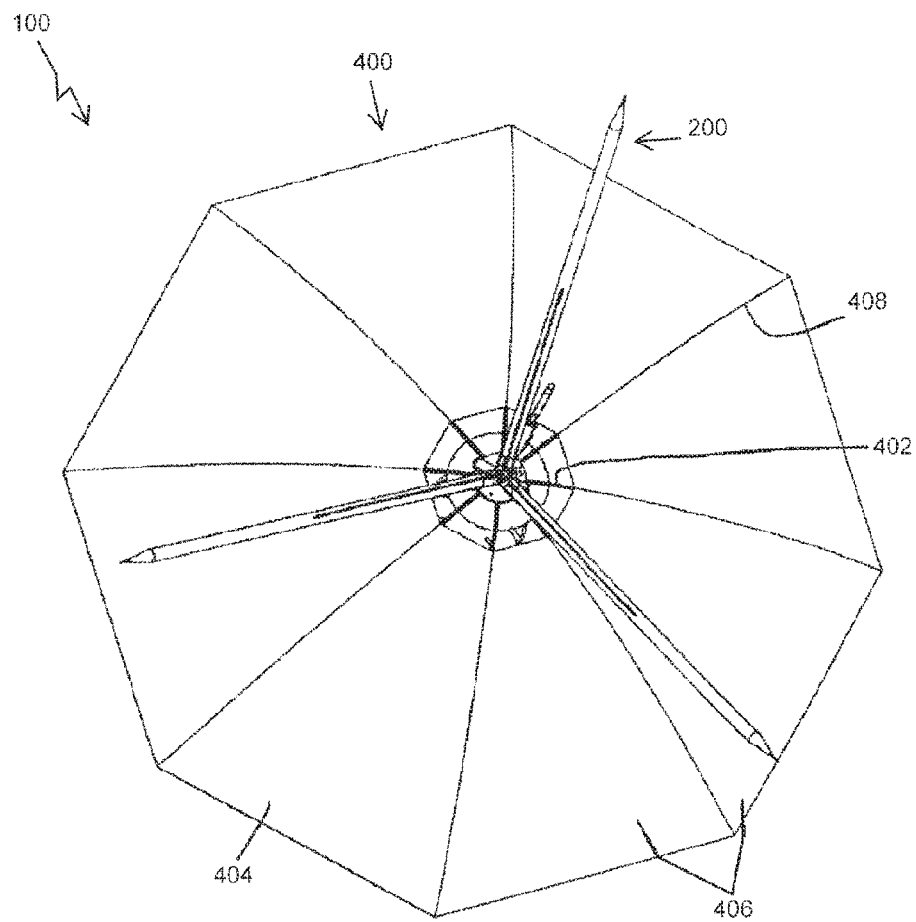
FIG. 3 is a schematic bottom view of the solar concentrator assembly of FIG. 1.
Figure 4:
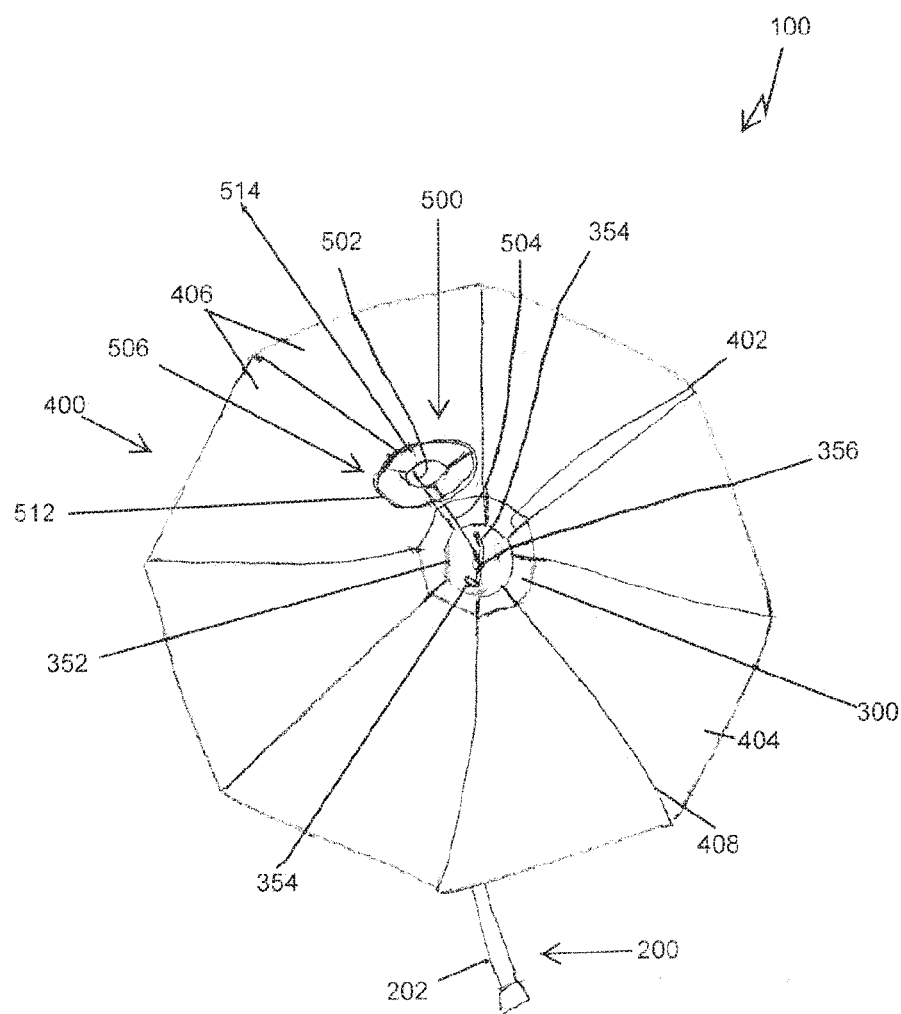
FIG. 4 is a schematic perspective view of the solar concentrator assembly in accordance with an embodiment of the invention.
Figure 16:
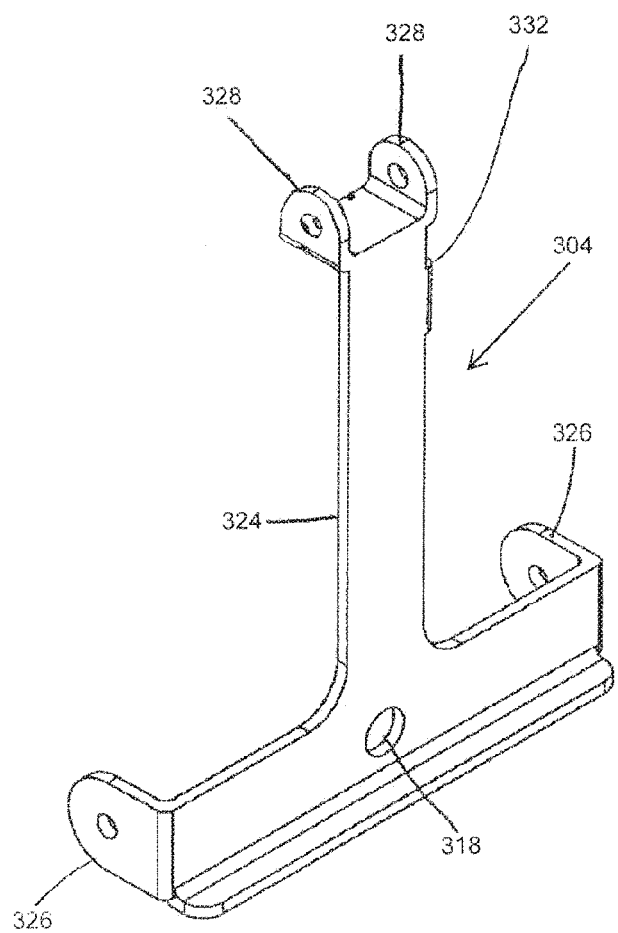
FIG. 16 is a schematic perspective view of the bottom support structure of the base of the solar concentrator assembly in accordance with an embodiment of the invention.
Figure 17:
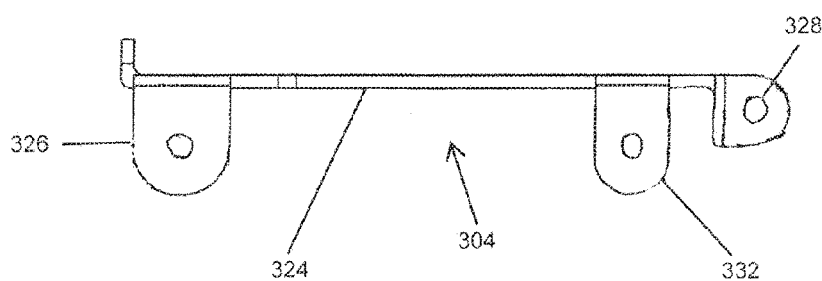
FIG. 17 is a schematic side view of the bottom support structure of FIG. 16.

FIGS. 16 and 17 depict various views of an embodiment of the bottom support structure 304. The bottom support structure 304 may have a substantially T-shaped configuration. The bottom support structure 304 includes a base surface 324 with projections 326 extending perpendicularly from the base surface 324. At the wide end of the bottom support structure, two projections 326 that extend perpendicularly from the base surface 324 engage similar projections from the top support structure 310 to connect pivotally therebetween. Additionally, the two projections 326 are bolted to corresponding projections from the top support structure 310, such that the top support structure 310 can pivot and tilt relative to the bottom support structure 304. Two side prongs 328 project away from the bottom support structure 304. The two side prongs 328 connect to the extension 306 and include apertures 330 in each so that a pin, bolt, or screw can attach the bottom support structure 304 to the extension 306, as described hereinabove. A third projection 332 extends perpendicularly from the base surface of the bottom support structure, similar to the first two projections 326. This third projection 332 engages with a receptacle 500, as shown in FIGS. 1 and 4 and discussed further hereinbelow. The bottom support structure 304 may be unitary. Other shapes or configurations of the bottom support structure 304 are contemplated (e.g., substantially rectangular or substantially square-shaped). Alternatively, the shape of the bottom support structure 304 may be substantially similar to the shape of the top support structure 310. Further, the bottom support structure 304 and/or the top support structure 310 each may be made by cutting the entire structure out of a flat sheet and bending them into shape, or welding together pieces of metal strips, or a combination of the two methods.

Figure 18:
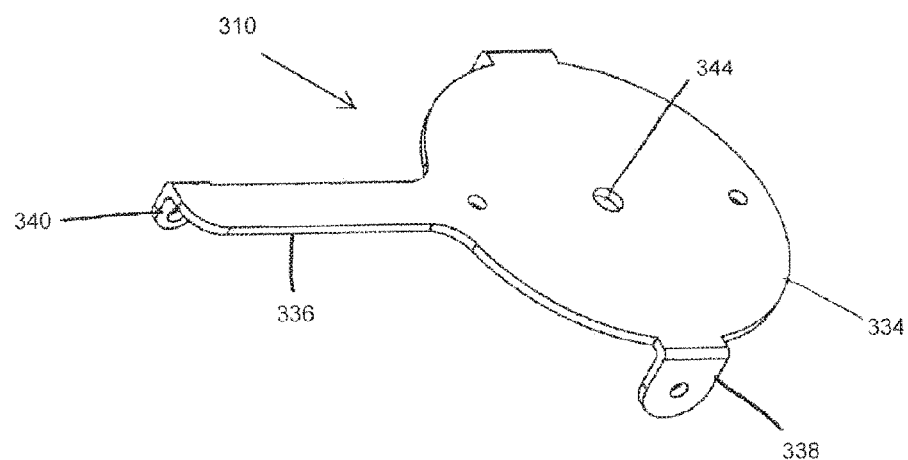
FIG. 18 is a schematic perspective view of a top support structure of the base of the solar concentrator assembly in accordance with an embodiment of the invention.
Figure 19:
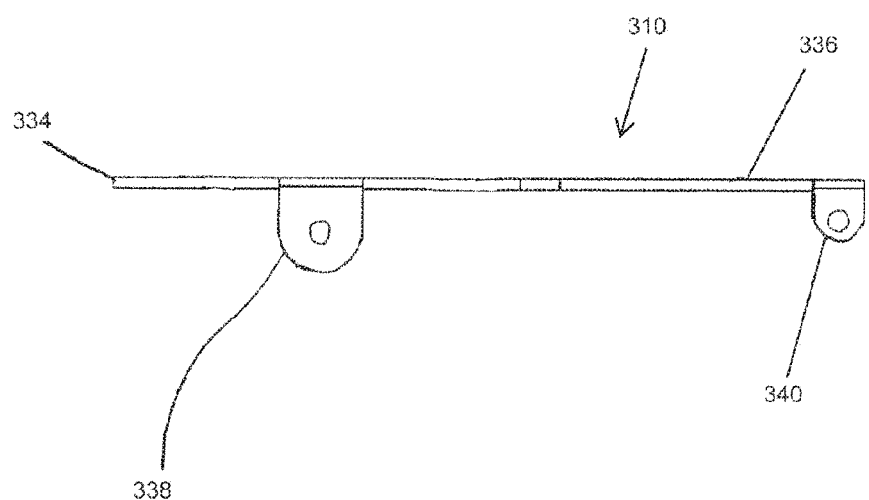
FIG. 19 is a schematic side view of the top support structure of FIG. 18.

FIGS. 18 and 19 depict various views of an embodiment of the top support structure 310. The top support structure may have a substantially pan-like shape, with a substantially circular head 334 and an elongate handle 336. The top support structure 310 includes a flat base with multiple projections 338, 340 extending perpendicularly therefrom. Two projections 338 are formed on opposite sides of the substantially circular head 334. These two projections 338 correspond and pivotally connect to projections 326 on the bottom support structure 304, as described hereinabove. A third projection 340 at the elongate handle 336 end of the top support structure 310 pivotably connects to the extension 306, also as described hereinabove. The top support structure 310 may be unitary. Other shapes or configurations of the top support structure 310 are contemplated (e.g., substantially rectangular or substantially square-shaped).

Figure 20:
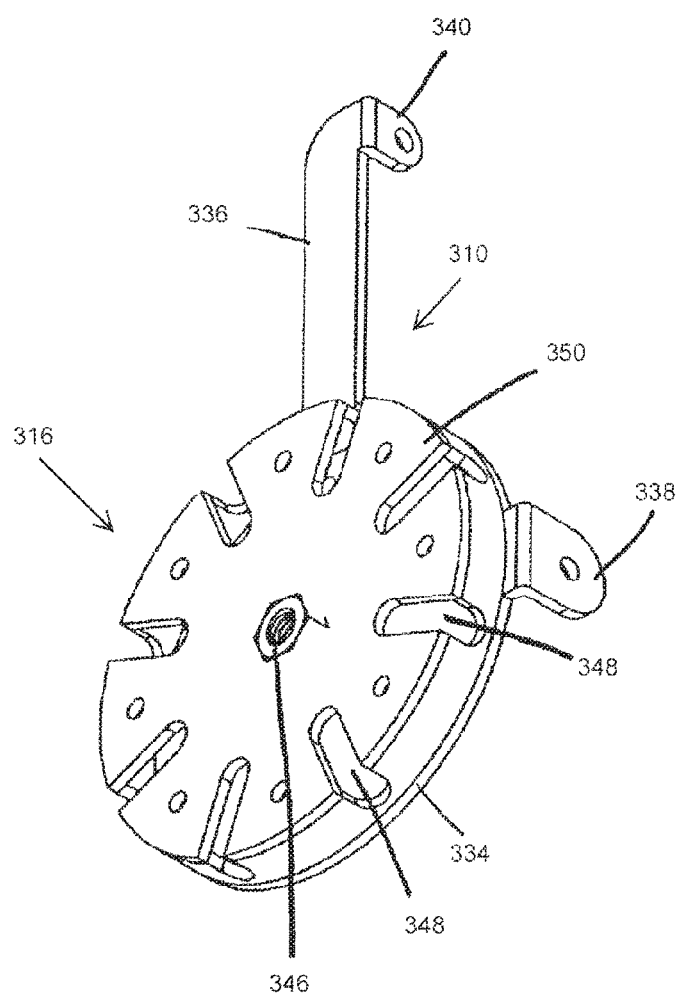
FIG. 20 is a schematic perspective of a cap and top support structure of the base of the solar concentrator assembly in accordance with an embodiment of the invention.
Figure 21:
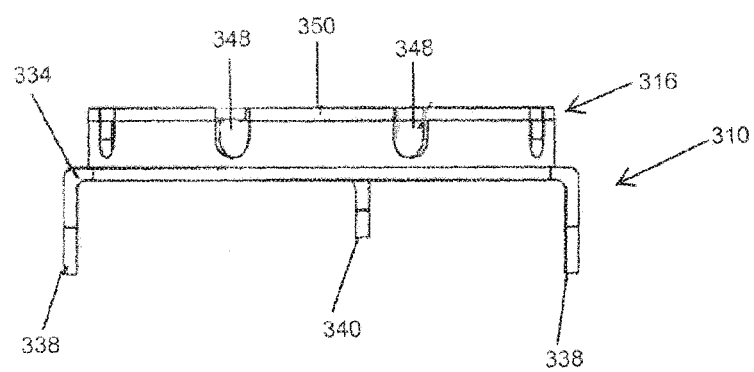
FIG. 21 is a schematic front view of the cap and top support structure of FIG. 20.
Figure 22:
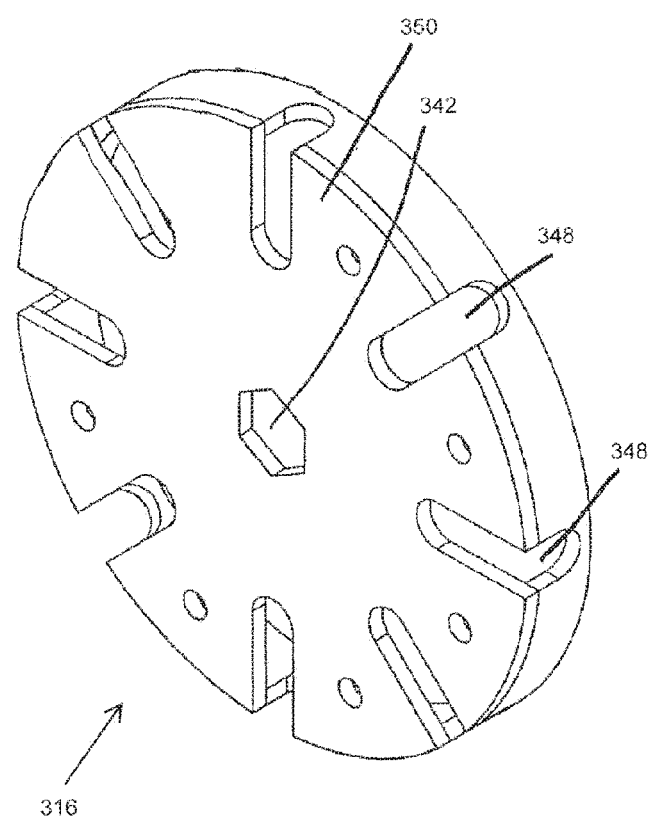
FIG. 22 is a schematic perspective view of the cap of the base of the solar concentrator assembly in accordance with an embodiment of the invention.

FIGS. 20 through 22 depict various views of an embodiment of the cap 316 mounted on top of the top support structure 310. FIG. 22 depicts an embodiment of the cap 316. The cap 316 is substantially circular and substantially identical in size and shape to the substantially circular head 334 of the top support structure 310. The cap 316 may have the same diameter as the substantially circular head 314 of the top support structure 310, absent the projections 338 on the sides of the substantially circular head 334. Alternatively, the cap 316 may have a diameter larger or smaller than substantially circular head 334 of the top support structure 310. The cap 316 is mounted on top of the top support structure 310. An aperture 342 formed about the center of the cap 316 aligns with an aperture 344 about the center of the substantially circular head 334 of the top support structure 310. The cap 316 may be affixed to the top support structure 310 via a threaded screw 346 through apertures 342, 344. Elongate notches 348 are also disposed about the perimeter of the cap 316, each corresponding to a dish support rod 402. The elongate notches 348 may be substantially evenly spaced about the perimeter of the cap 316. Additionally, the opening of the elongate notches 348 may extend down the side of the cap 316 without extending all the way to and through the bottom side of the cap 316. Alternatively, the elongate notches 348 do extend all the way to and through the bottom side of the cap 316. In an embodiment, the top surface 350 of the cap 316 may be removable. The top surface 350 of the cap 316 may be attached through various removable means, including with screws, nails, or a snap-fit connection.

Referring back, FIG. 4 depicts an embodiment of the solar concentrator assembly 100 with a compression plate 352. The compression plate 352 may be substantially the same size and shape as the cap 316. Alternatively, the compression plate 352 may be larger than the cap 316. For example, the diameter of the compression plate 352 may be about twice the diameter of the cap 316. Additionally or alternatively, the compression 352 plate includes a lip, e.g., disposed about and/or along the circumference, for added rigidity and to provide deeper compression. The compression plate 352 includes handles 354 and a compression crank 356, a threaded rod, about the center of the compression plate 352. Operation of the compression crank 356 secures and tightens the compression plate 352 to the cap 316. The compression crank 356 may be a wing nut. The handles 354 may be secured to the compression plate 352 through various means, including via welding, screws, and adhesive. Alternatively, the handles 354 form a unitary structure with the compression plate 352.

Referring back, FIGS. 1 through 4 depict various views of an embodiment of the reflective dish module 400. The reflective dish module includes multiple dish support rods 402 and a pliable material 404. The pliable material 404 includes multiple panels 406 corresponding to an equal number of dish support rods 402. The panels 406 may be formed by sewing them together, or by any other means, which forms seams 408 therebetween. The pliable material 404 may be a sturdy cloth, fabric (e.g., yak hair or wool canvas, ripstop fabric), or plastic. A light and flexible reflective material layer (not shown) is disposed on top of the sturdy cloth, fabric, or plastic. The light and flexible reflective material may be disposed on the sturdy cloth, fabric, or plastic in a variety of manners (e.g., sewing or using adhesive). The light and flexible reflective material may be an aluminized plastic polymer, MYLAR®, polyethylene terephylalate, recycled chip bags, reflective food packaging, metal foil, aluminum foil, or mesh network of small glass mirrors. The dish itself may also be asymmetric, where not all the panels 406 are of equal size and certain panels 406 are made larger to take advantage of solar incident angle.

In one embodiment, the panels 406 include a flexible layer of plastic, fabric, woven textile, non-woven textile, ripstop fabric, and/or canvas. A reflective coating or layer may be applied to the flexible layer using various methods. For example, the flexible layer may be metalized using vacuum deposition, electroplated using a transparent conductive layer, laminated or glued to a metalized MYLAR® (PET) film, and/or sewn to a metalized MYLAR® (PET) film. In addition, the flexible layer may be supported by a fabric backing, a semi-rigid plastic sheet, and/or a fiberglass or metal (e.g., aluminum) skeleton.

The dish support rods 402 may be sturdy, yet flexible. For example, the dish support rods 402 may be made of bamboo, fiberglass, metal, or plastic. In assembling the reflector dish module 400, the dish support rods 402 are inserted into the seams 408 between each of the panels 406. The other ends of the dish support rods 402 are inserted into the elongate notches 348 in the cap 316 of the base module 300 so that the dish support rods 402 are radially protruding therefrom. Additionally, a single cable (not shown) may be threaded through a small hole at the end of each rod 402. The cable connects the rods 402 together. The ends of the rods 402 and cable may be housed in the cap 316. The sturdy cloth or fabric may not cover all of the dish support rods 402 when they are inserted into the elongated notches 348 of the cap 316. Or the reflective dish may be attached or clipped to the rods 402 with plastic or metal clips. In this arrangement, a cloth sleeve may not be used. Alternatively, the sturdy cloth or fabric covers substantially all of the dish support rods 402 when they are inserted into the elongated notches 348 of the cap 316. The rods 402 may also be inserted into sleeves or runners made from, for example, canvas, nylon, or neoprene that separate each panel 406. Once the rods 402 are inserted into the seams 408 of the sturdy cloth or fabric and the elongated notches 348 of the cap 316, the compression plate 352 may be placed over the cap 316. Adjusting the compression crank 356 of the compression plate 352 tightens the compression plate 352 against the cap 316, which tensions the portion of the dish support rods 402 disposed in the base module 300. Tensioning the dish support rods 402 creates the rigid, substantially parabloid shape of the reflector dish. Setting up the reflector dish module 400 in this manner allows a single person to assemble or dissemble the entire reflector dish module 400 quickly and efficiently. In another embodiment, the dish support rods 402 are pre-bent, which may remove the need compression plate 352 and/or compression crank 356.

The shape of the assembled reflector dish module 400 may take the form of any parabola-type shape. For example, the shape may include a uniform parabola or a compound parabola, in which certain sections or portions of the assembled reflector dish module 400 are substantially parabloid and other remaining sections or portions may take the form of any geometric shape. In various embodiments, the reflector dish module 400 may be adjustable such that a user may manipulate various portions or sections to form a uniform parabola or a compound parabola shape. In these configurations, the user may control the shape of the reflector dish module 400 to control the concentration, collection, and direction of solar energy. For example, portions of the dish support rods 402, pliable material 404, panels 406, and seams 408 may be flexible and/or adjustable to allow a user to change the shape of the reflector dish module 400 among any type of parabola-shape.

In one embodiment, to assemble the solar concentrator assembly 100, the tripod module 200 is unfolded such that the legs 202 are spread to provide a foundation and placed on the ground. The rod 302 of the base module 300 may be received by the center apertures 214, 224 in the top tripod connector 208 and bottom tripod connector 218 of the tripod module 200. The rod 302 may be lowered to at least as low as the bottom support structure 304 of the base module 300 contacting the top tripod connector 208 of the tripod module 200. The rod 302 may be affixed to the tripod module 200 by an adjustable screw 234 (e.g., a thumb screw or wing nut) that is threaded from the bottom tripod connector 218. Because the adjustable screw 234 is manually operable, the user may rotate and pan the base module 300 about the vertical axis. Furthermore, as described hereinabove, the reflector dish module 400 may be constructed by inserting the dish support rods 402 into seams 408 of a sturdy cloth or fabric and placing the other ends of the dish support rods 402 into elongated notches 348 in the cap 316 of the base module 300. This step in the assembly may not be necessary each time the solar concentrator assembly 100 is set up. For example, the solar concentrator assembly 100 may be folded with the dish support rods 402 inserted in the elongate notches 348. The user may operate the compression crank 356 to tighten the compression plate 352 to the cap 316 and to tension the dish support rods 402 to form the substantially parabloid shape or compound parabloid of the reflective dish 400. The user may manipulate the hand cranked threaded screw 312 of the extension 306 to control the tilt of the reflector dish 400. Accordingly, by controlling the tilt of the reflector dish module 400 and the pan of the base module 300 and reflector dish module 400, the user can move the reflector dish 400 about any arbitrary trajectory.

Once the reflector dish 400, base 300, and tripod 200 modules are assembled, a receptacle 500 may be affixed to the base module 300. Referring back, FIG. 1 depicts an embodiment of the receptacle 500. The structure of the receptacle 500 may include a four bar linkage system, where the base module 300 is the bottom linkage. In this configuration, the receptacle 500 and the contents therein may remain level throughout tilt adjustment of the reflector dish module 400. One side bar 502 of the four bar linkage connects to (e.g., via a bolt, screw, etc.) the third projection 332 from the bottom support structure 304 through the opening between the sturdy cloth or fabric and the cap 316 and compression plate 352. The other side bar 504 of the four bar linkage connects to the compression plate 316. The top part 506 of the four bar linkage may be disposed within the concave part of the reflector dish module 400 and may form any structure that receives an apparatus, such as a pot. For instance, FIG. 1 depicts the top linkage 506 of the receptacle 500 as a frame 508 with a concave, semi-circular link 510 to support the frame 508. The frame 508 may be a circle or it may be any other geometric shape. Alternatively, FIG. 4 depicts two concentric circles or rings 512, 514 connected together by additional links or by an outer circle with links that point towards the center, but are not connected to a second inner circle. In both embodiments, an apparatus, such as a pot, may fit into the top part 506 of the four bar linkage. Alternatively, the top linkage 506 may form any structure that will receive an apparatus, such as a pot. For example, the top linkage 506 may form an open semi-circle or concave shape adapted to receive a pot.

The assembled solar concentrator assembly 100 may harness solar energy for various purposes. By way of example only, additional, interchangeable modules may allow a user to generate electricity, cook food, and generate heat.

Referring again to FIGS. 1-4, the seams 408 of the reflective dish module 400 may include elastic strips to support the dish support rods 402. In this case, the panels 406 are separated by the elastic strips rather than being attached directly to each other. The elastic strips may help to evenly distribute forces across the panels 406. For example, the elastic strips may provide tension along the dish support rods 402 and/or between the panels 406. Use of the elastic strips provides enough tension to the panels 406 so that they are held in the proper position without being deformed.

In another embodiment, the reflective dish module 400 may include clips to hold the pliable material 404 to a central support rib hub, such as the cap 316, the compression plate 352, and/or the top surface 350. Clips may also be used to secure the pliable material 404 to the outer ends of the dish support rods 402.

To assemble the reflective dish module using the clips, in one embodiment, a user first inserts the dish support rods 402 into the support rib hub. The dish support rods 402, which may be curved or pre-bent and made of metal (e.g., aluminum), are inserted so that they are curved in the same direction. The user may then place the attached dish support rods 402 on the ground so that the dish support rods 402 point downward and the support rib hub is supported in the air. The user may then unfold the pliable material and grasp it by a center portion, such as a center hole. The user may then clip the pliable material to the support rib hub. Specifically, the user may attach hooks or clips near the center hole of the pliable material to corresponding clips or hooks on the support rib hub. Next, the user chooses a single dish support rod 402 and attaches the outer edge of the dish support rod 402 to a corresponding outer edge clip on the pliable material 404. As seen from above, if the first outer edge clip were placed at six o'clock, a second outer edge clip located at 12 o'clock may be secured to its corresponding dish support rod 402. A third outer edge clip located at three o'clock may be secured next, followed by a fourth outer edge clip located at nine o'clock. The remaining outer edge clips may be attached to the remaining dish support rods 402 in any order.

FIGS. 23 through 26 depict various views and embodiments of a thermoelectric module 600. A thermoelectric module 600 may be placed in the top linkage 506 of the receptacle to generate electricity. The electricity may be used for various purposes, including charging batteries, lighting, and charging and powering electric devices. In addition or as an alternative to generating electricity, the thermoelectric module 600 and the solar concentrator assembly 100 may heat or boil water.

The thermoelectric module 600 may utilize at least one thermopile or any other thermoelectric device 602 that converts thermal energy to electrical energy. Thermopiles generate electricity from a temperature gradient across their surface. An example of a thermopile includes, but is not limited to, bismuth telluride thermopile (available from Evened Technology Co., Ltd., Shenzhen, China), which has a high ratio of electrical conductivity to thermal conductivity at temperatures in the range of 50-200° C. The temperature gradient is the temperature difference between the bottom 604 and top 606 sides of the thermoelectric device 602. The bottom side 604 is the hot side of the device, insofar as thermal energy is directed to the bottom side 604 by the solar concentrator assembly 100. The top side 606 is the cold side of the device, insofar as the top side 606 may be exposed to ambient air, which may be cold, or may be cooled through various mechanisms.

Additionally, the temperature of the hot side 604 of the thermoelectric device 600 may be enhanced to accentuate the temperature gradient. For example, solar energy may be concentrated and focused on to the bottom side via a Fresnel lens 608. Various lenses may be used with desirable characteristics, such as compactness, low-cost, and durability. The hot side 604 may also be enclosed completely by the body of the thermoelectric device 602 and a glass panel to eliminate convective losses.

Figure 24:
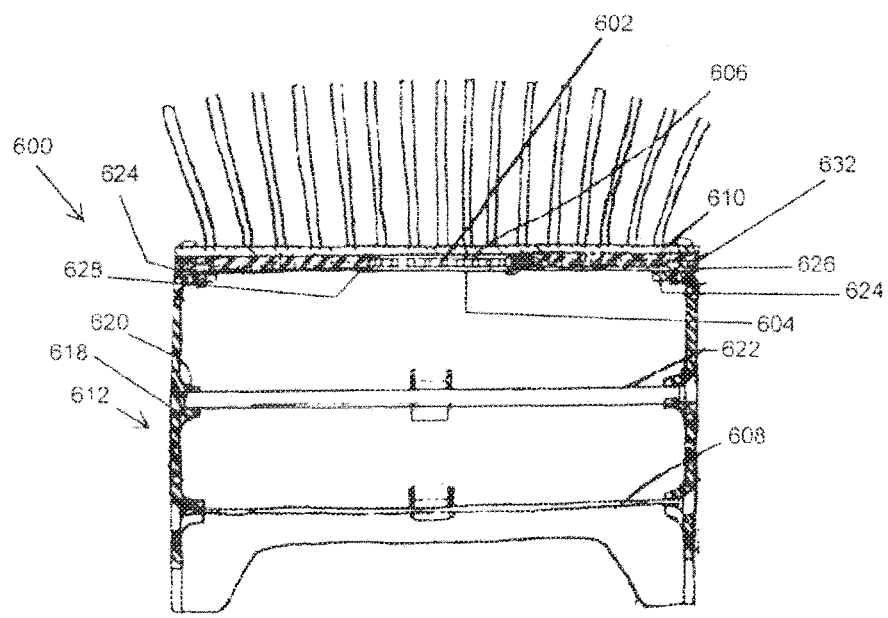
FIG. 24 is a schematic cross-sectional view of the thermoelectric module of FIG. 23.
Figure 25:
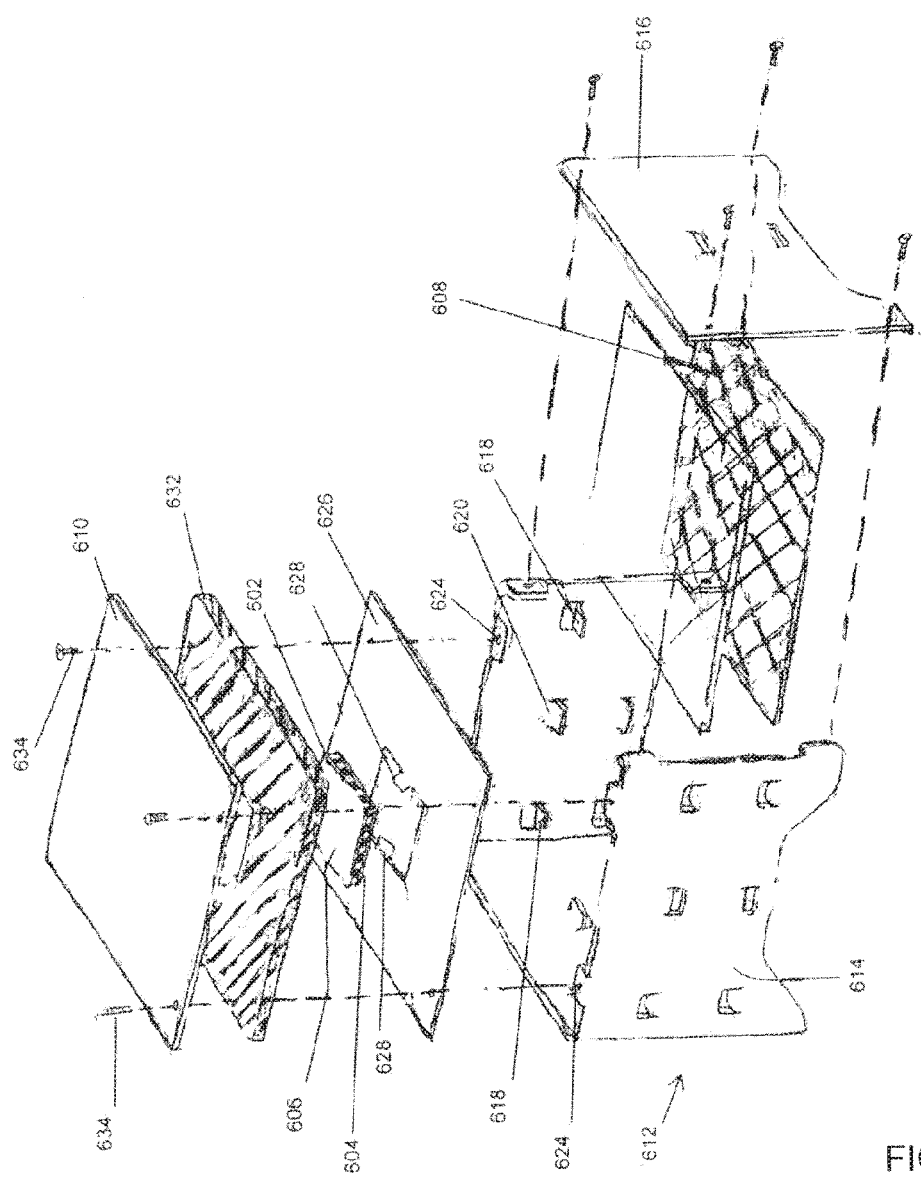
FIG. 25 is a schematic exploded view of the thermoelectric module of FIG. 23, without the heat sink.

Additionally or alternatively, the cold side 606 of the thermoelectric device 600 may be similarly enhanced to accentuate the temperature gradient. The cold side 606 may be enhanced with various methods. For example, a heat sink 610 may be mounted to and/or on top of the cold side 606. The heat sink 610 draws heat away from the cold side 606 of the thermoelectric device 602, thereby making the surface cooler. For example, FIGS. 24 through 26 depict various views and embodiments of a thermoelectric module 600 with an enhanced hot side 604 and an enhanced cold side 606. In particular, in one embodiment, a Fresnel lens 608 is used to enhance the hot side 604 of the thermoelectric device and a heat sink 610 is used to enhance the cold side 606 of the thermoelectric device 602. The thermoelectric module 600 may include a main body 612 with four side walls 614, 616 defining an interior space and an open bottom. At least one side wall 616 may be removable from the remaining three side walls 614, which may be formed from one integral structure. The removable side wall 616 may be affixed to the remaining three side walls 614 through various means, including with screws, adhesive, rivets, or nails. Each of the side walls 614, 616 may include multiple retaining projections 618, 620 protruding from the side walls 614, 616. The retaining projections 618, 620 may be formed on two levels of the side walls, one higher than the other. Each of the levels for the retaining projections 618, 620 may hold or retain a plate, such as a glass plate 622 and/or a Fresnel lens 608. For example, the glass plate 622 may be retained at a level higher than the Fresnel lens 608. Because the bottom of the main body may be open and the main body 612 is disposed within the concave part of the reflector dish 400, solar energy may be directed to the Fresnel lens 608, which then concentrates and directs energy to the bottom side 604 of the thermoelectric device 602. Additionally, the retaining projections 618, 620 may all be oriented in the same direction (not shown). For example, all of the retaining projections 618, 620 may project upwards or downwards. Alternatively, with respect to each level of the retaining projections 618, 620, the orientation of the retaining projections 618, 620 may be asymmetrical in that at least one retaining projection may project upward 618 and at least one retaining projection may project downward 620. In this manner, plates 608, 622 that are slid and placed onto or between the retaining projections 618, 620 may have a secure fit. The retaining projections 618, 620 may be integrally formed with the side walls 614, 616. Alternatively, the retaining projections 618, 620 are affixed to the side walls through various means, including with adhesive, screws, rivets, and nails. Moreover, the retaining projections 618, 620 may be an elongate element spanning substantially the length of each side wall 614, 616 (not shown). The elongate element may be integrally formed with a side wall 614, 616 or may be affixed to a side wall 614, 616 through the aforementioned various means.

In another embodiment, the top of the main body 612 is generally open, with the exception of a portion of the top 604 that contacts and is affixed to a thermoelectric module retaining plate 626. The portion of the top 624 that contacts the thermoelectric module retaining plate 626 may be a protuberance 624 that projects into the open interior space. There are four protuberances 624 shown in FIG. 25, but the main body 612 may have fewer or more of the protuberances 624 than shown. The thermoelectric module retaining plate 626 forms an interior aperture or recess that corresponds in shape and fits with a thermoelectric device 602, such as at least one thermopile. For example, if the thermoelectric device 602 is substantially square-shaped, the interior aperture or recess of the thermoelectric module retaining plate 626 may also be substantially square-shaped. In an embodiment, the thermoelectric device 602 sits on top of the interior recess. Alternatively, the interior aperture may include at least one mounting platform 628 projecting into the open space. In this configuration, the thermoelectric device 602 may be placed on top of the at least one mounting platform 628. In another alternative embodiment, the thermoelectric module retaining plate may be a metal plate 630 without a recess or an aperture. In this configuration, thermal energy directed to the metal plate 630 will heat the metal plate 630, which is in contact with the thermoelectric device 602.

A thermal insulator layer 632 may be placed on top of the thermoelectric module retaining plate 626. The thermal insulator layer 632 defines an interior space that corresponds in shape with the thermoelectric device 602. The thermal insulator layer 632 may be made from a variety of materials capable of insulating heat, including, but not limited to, felt, wood, or a combination thereof. The top side 606 of the thermoelectric device 602 may be substantially flush with the top of the thermal insulator layer 632. In this manner, a heat sink 610 that is mounted on top of the thermal insulator layer 632 may be in contact with the top side 606 of the thermoelectric device 602.

Figure 23:
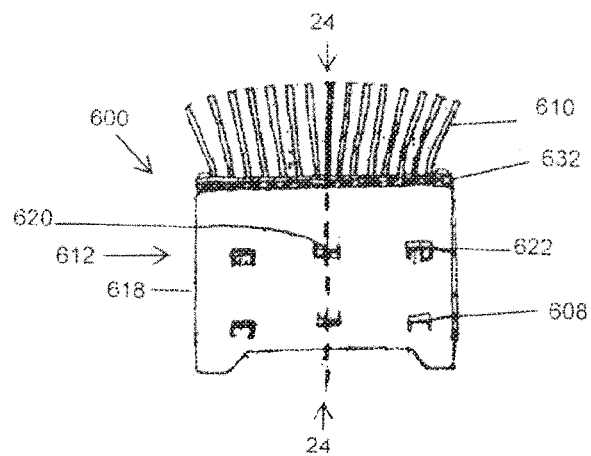
FIG. 23 is a schematic side view of a thermoelectric module in accordance with an embodiment of the invention.

The heat sink 610 may be mounted on top of the thermal insulator layer 632, which itself may be on top of the thermoelectric module retaining plate 626, which in turn may be on top of the main body 612. These elements may be affixed together through various means, including with screws 634, rivets, or nails, through corresponding and aligned holes in each component. Alternatively, as shown in FIG. 23, only the thermal insulator layer 632, thermoelectric module retaining plate 626, and the main body 612 are affixed together.

In an embodiment, the main body 612 may have a substantially cylindrical shape. In this configuration, the thermoelectric module retaining plate 626 and thermal insulator layer 632 may be similarly substantially circular or cylindrical.

In another embodiment, to enhance the cold side 604 of the thermoelectric device 62, a small electric fan powered directly by the thermoelectric device 602 faces and cools the top side 606. Blowing air over or on top of the top side 606 draws heat away and/or cools the top side 606. Referring to FIGS. 26 and 27, in yet another embodiment, to enhance the cold side 606 of the thermoelectric device 602, a fluid resistor may be placed on the top side 606 of the thermoelectric device 602. A fluid resistor can dissipate energy, such as thermal energy. One example of a fluid resistor is a vessel 636 of water, such as a kettle 638 or a pot 639. The kettle 638 or pot 639 of water will draw thermal energy away from the top side 606 of the thermoelectric device 602, thereby accentuating the cold side. In this embodiment, because the thermoelectric device 602 is in thermal contact with a vessel 636, 638, 639 of water, the temperature of the cold side 606 never rises above 100 degrees Celsius—while the temperature of the hot side 604 may be much greater than 100 degrees Celsius. This embodiment increases the efficiency of electricity generation from the thermoelectric device 602, via the enhanced temperature gradient across the thermoelectric device 602, while still facilitating further uses, such as heating or boiling water, simultaneously.

In an alternative embodiment, the vessel 636 of water, such as a kettle 638 or pot 639, and thermoelectric device 602 may be used separately from the solar concentrator assembly 100, for example, on a stove or fire to generate electricity, in lieu of generating electricity via solar energy. For example, the vessel 636 of water may be placed on the top side 606 of the thermoelectric device 602 which is in turn placed on or above a stove or fire. Further, in a similar arrangement, the vessel 636 of water and thermoelectric device 602 may be placed in the receptacle 500, such that the vessel 636 of water and thermoelectric device 602 are disposed above the stove or fire when the receptacle 500 is placed about or above the stove or fire. In a further embodiment, the thermoelectric device 602 may be integrated into the bottom of the vessel 636 of water. For example, the thermoelectric device 602 may be integrally formed with or placed into a chamber or cavity in the bottom of the vessel 636 of water. In this arrangement, the top side 606 of the thermoelectric device 602 may be exposed to or in thermal contact with the bottom of the vessel 636 of water.

Referring back to FIG. 26, in an alternative embodiment, the thermoelectric module may use a combination of a fluid resistor 636, 638, 639 and a heat sink 610. For example, the heat sink 610 may be disposed in a watertight container 636, which may be filled during use. In this configuration, the bottom surface of the watertight container 636 may be in thermal contact with the thermoelectric device 602.

As an alternative to the thermoelectric module 600, a heat transfer module 700 may be used with the solar concentrator assembly 100. For example, when the solar concentrator assembly 100 is not being used for cooking or heating water, the heat transfer module 700 may be used to generate and/or circulate heat. The heat transfer module 700 may include a heating coil 702, a heat dissipater 704 connected to the heating coil 702, and a heat transfer fluid 706 that may circulate within and between the heating coil 702 and the heat dissipater 704. In this embodiment, the heating coil 702 may be placed in the receptacle 500. The heating coil 702 may be copper tubing that is tightly coiled. In this manner, the amount of tubing can be maximized in the focal region of the reflector dish. In an embodiment, the amount of tubing in the receptacle may be further maximized by utilizing tubing with a small diameter, e.g., with a 1 mm diameter. In an alternative embodiment, the heating coil 702 may be placed in a glass jar 708 for added insulation, which is placed in the receptacle 500.

The heat dissipater 704 may include an array of tubes 710 or a small tank 712. In an embodiment, the heat dissipater 704 may be placed at a slightly higher level than the heating coil 702. In this manner, heated heat transfer fluid 706 may more easily flow from the heating coil 702 to the heat dissipater 704, where the heat transfer fluid cools and sinks and the heat transfer fluid 706 flows back to the heating coil 702. The inlet 714 of the heating coil 702 is connected to the outlet 716 of the heat dissipater 704, and the outlet 718 of the heating coil 702 is connected to the inlet 720 of the heat dissipater 704. The heat dissipater 704 may be connected to the heating coil 702 through various durable insulating tubing. By way of example only, PEX tubing connects the heating coil to the heat dissipater.

Figure 29:
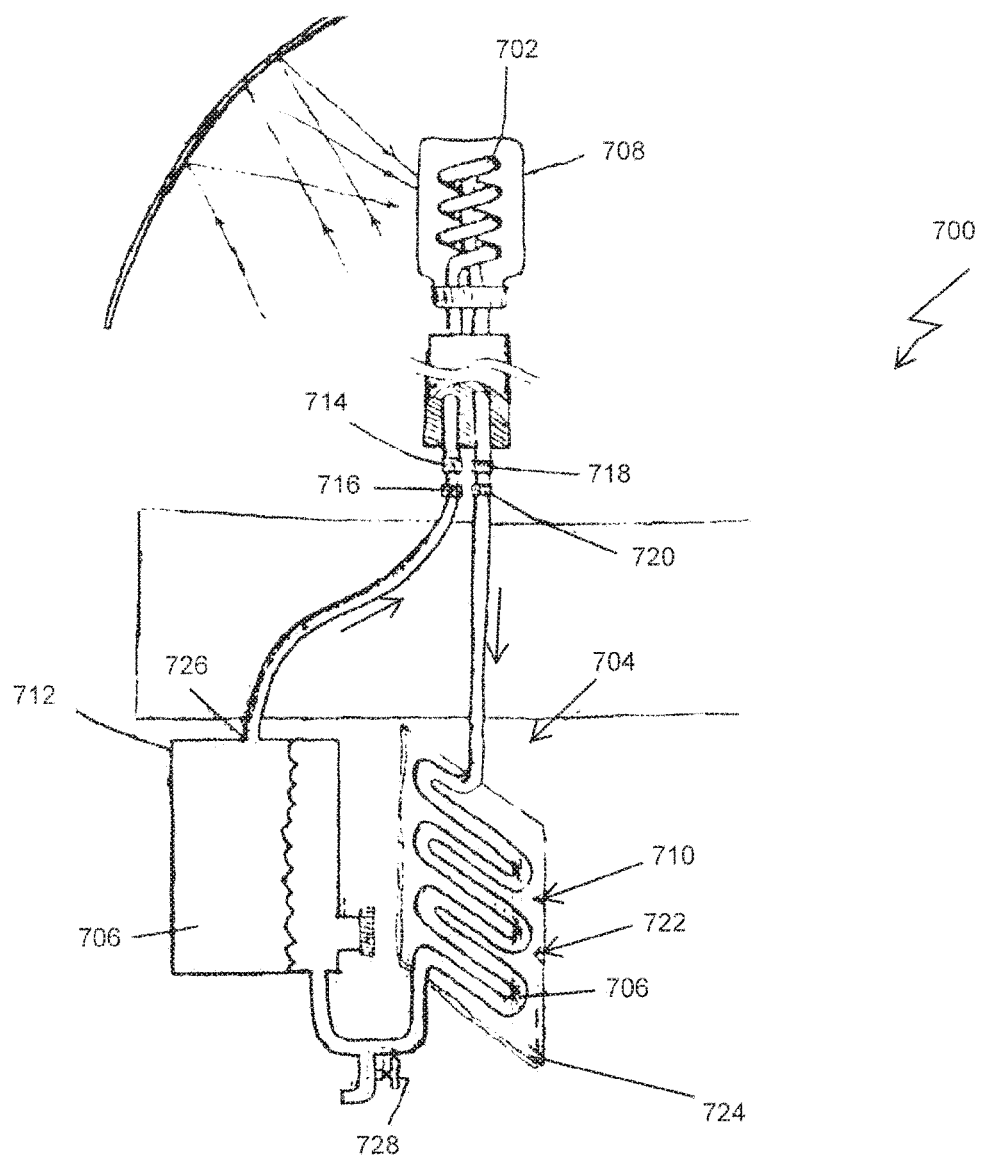
FIG. 29 is a schematic perspective and partial cross-sectional view of a heat transfer module in accordance with an embodiment of the invention.

Alternatively, as shown in FIG. 29, the heat dissipater 704 includes both an array of tubes 710 and a small tank 712. Similar to a heat exchanger unit, a portion of the array of tubes 722 may be coiled and placed on a horizontal plane to increase the surface area of this portion as it exudes heat. For example, this portion of the array of tubes 722—a heat exchanging portion—may be placed in a central location of a residence or embedded in a sleeping platform to provide and exude heat from this increased surface area. Furthermore, this portion of the array of tubes 722 may be placed on top of insulated material 724 to keep the direction of heat transfer upward. In this embodiment, heat transfer fluid 706 flows from this heat exchanging portion 722 to a tank 712. The tank 712 may be a reservoir of cold heat transfer fluid 706. The outlet 726 from the tank may be placed somewhere about half of the height of the tank 712 such that the cold heat transfer fluid 706 may flow back to the heating coil 702 when the tank 712 starts to fill up. Alternatively, a spigot 728 may be placed between the heat exchanging unit portion 722 and the tank 712. In this configuration, if the heat transfer fluid 706 is water and it has reached sufficient temperature for pasteurization, the water may be collected at the spigot 728 for use.

The heat dissipater 704 may function as an indoor heater that may be used to radiate heat directly to an indoor living space. Alternatively, the heat dissipater 704 may be used to charge materials of appropriate heat capacity that may release heat for later use (e.g., at night time). Such materials may include paraffin, stone, or adobe. Additionally, a portion of the heat dissipater 704 may be embedded directly into or under the adobe or a sleeping platform, such that the adobe or sleeping platform may be heated during the day. The sleeping platform may be constructed from various materials, such as wood. In an additional or alternative embodiment, the sleeping platform is insulated by a mattress and/or blankets so that, over the course of a day, the sleeping platform retains much of the thermal energy from the heat dissipater 704. In this manner, a user will have a warmer bed to sleep in during a cold night. The heat dissipater 704 may also be used to heat clothing or bedding before use. In this embodiment, a portion of the heat dissipater 704, for example, tubing, may be positioned to run the heat transfer module 700 from the solar concentrator assembly 100, which is outdoors, to a residence. In this embodiment, the tubing may be contained within recycled plastic bottles with cardboard inserts laminated with aluminized plastic polymer film. The cardboard inserts are of the appropriate width to create a parabolic trough reflector that focuses solar radiation on the tubing to allow the heat transfer fluid to be heated outside of the solar concentrator assembly. These reflective heating components concentrate additional solar energy on the tubing while also insulating the tubing via the greenhouse effect. Within the residence, the tubing may be extended through the sleeping platform or the walls of the residence to reduce heat loss. To further minimize heat loss from the tubing, exposed lengths of the tubing may be wrapped in additional insulation (e.g., cloth, leather, fur, and grass or any other suitable insulated material). In addition or alternatively, the exposed lengths of tubing may be placed on top of insulated materials to reduce heat loss.

Because the heat transfer module 700 may be a closed circulation loop, the heat transfer fluid 706 may be non-toxic or toxic. For example, the heat transfer fluid 706 may be water or household oils, which may be desirable for their low-cost and availability. In an additional or alternative embodiment, antifreeze and alcohol may be used, in part to prevent water-based systems from freezing at night and to prevent water from becoming corrosive. Commercially available heat transfer fluids may also be used. In an embodiment, the heat transfer fluid 706 is a mixture of water and alcohol. For example, the mixture may be about one-half parts water and one-half parts alcohol. Alternatively, the alcohol component of this mixture may be greater or lesser than the water component.

Further as described hereinabove, heat transfer fluid 706 may flow through the heating coil 702 and the heat dissipater 704 passively or actively, due to the thermosiphon effect, various pumps, or a combination of both. Passive flow is due to the thermosiphon effect in which thermal energy heating the heat transfer fluid 706 induces movement and circulation of the heat transfer fluid 706 through the heat transfer module 700. For example, in the embodiment where at least a portion of the heat dissipater 704 is elevated slightly higher than the heating coil 702, heat transfer fluid 706 may flow through the heat transfer module 700 due to the thermosiphon effect and the pressure or height difference. Alternatively, the heat transfer fluid 706 may move through the module by active means using various pump arrangements. For example, in conditions in which the passive thermosiphon effect cannot overcome heat loss from the dissipater, a small pump may be used to facilitate flow of the heat transfer fluid 706. An electric pump, which may be powered or charged by the thermoelectric device 602, may be used. In further embodiments, various mechanical pumps may be used, including, but not limited to, bucket gravity pumps and hand pumps. For example, hand pumps may be rotary hand pumps built into existing household items, such as prayer wheels.

Figure 30:
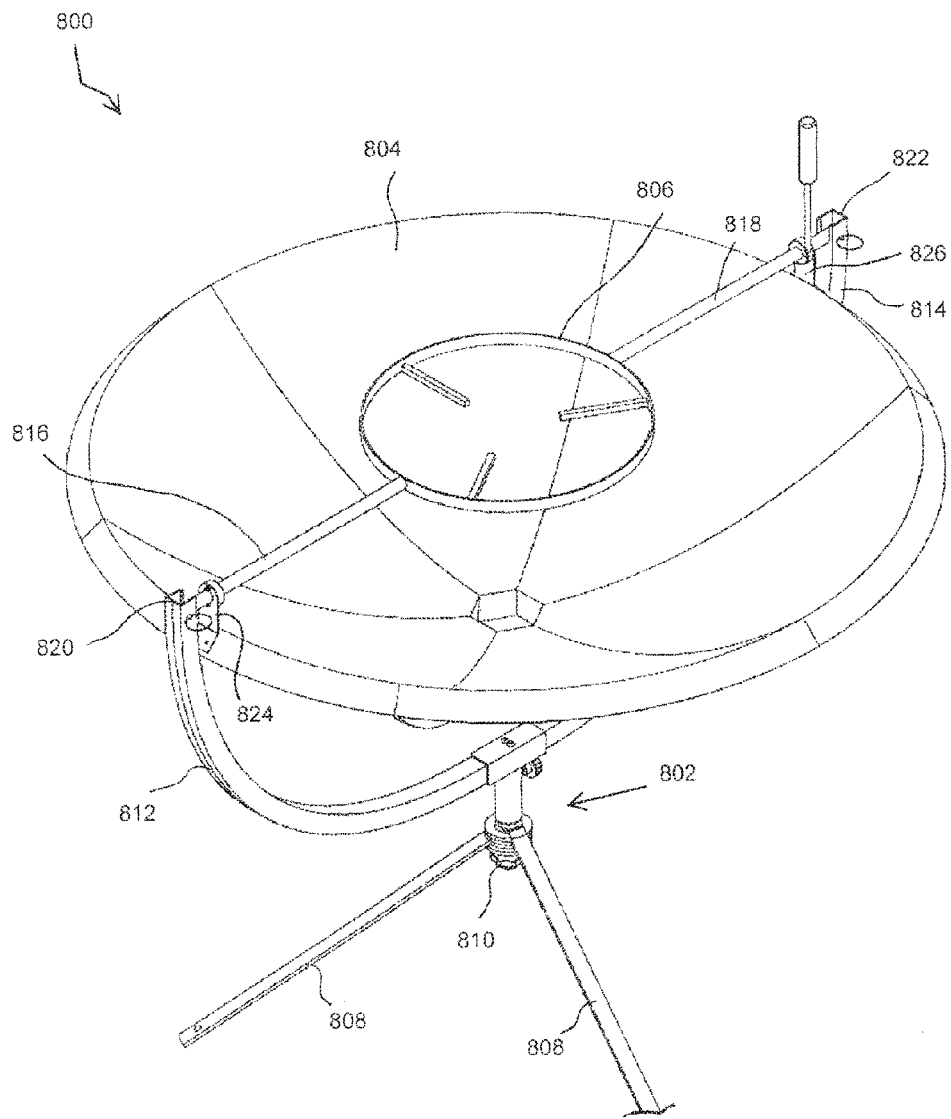
FIG. 30 is a schematic perspective view of a solar concentrator assembly in accordance with an embodiment of the invention.
Figure 31:
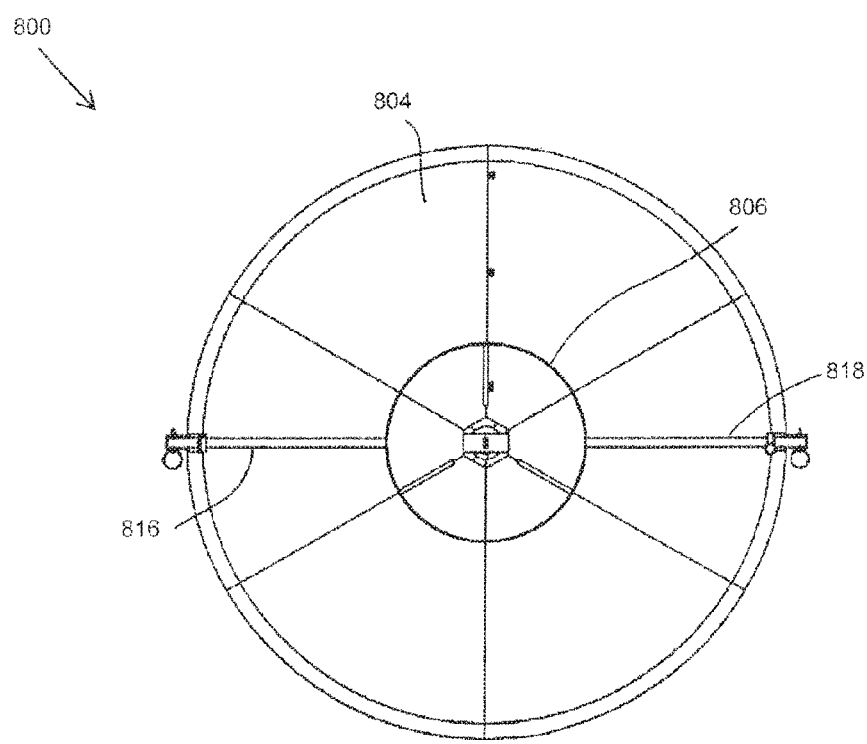
FIG. 31 is a schematic top view of a solar concentrator assembly in accordance with an embodiment of the invention.

Referring to FIGS. 30 and 31, an embodiment of a solar concentrator assembly 800 includes a stand 802, a rigid dish 804, and a pot stand 806. The stand 802 includes a plurality of legs 808 joined together at a vertical support assembly 810. The stand 802 also includes curved support members 812, 814 that are connected to the vertical support assembly 810 and curve under and around the rigid dish 804. The pot stand 806 is supported with hanging shafts 816, 818 that are attached at top or distal ends 820, 822 of the curved support members 812, 814. The rigid dish 804 is suspended from the hanging shafts 816, 818 by hangers 824, 826.

Figure 32:
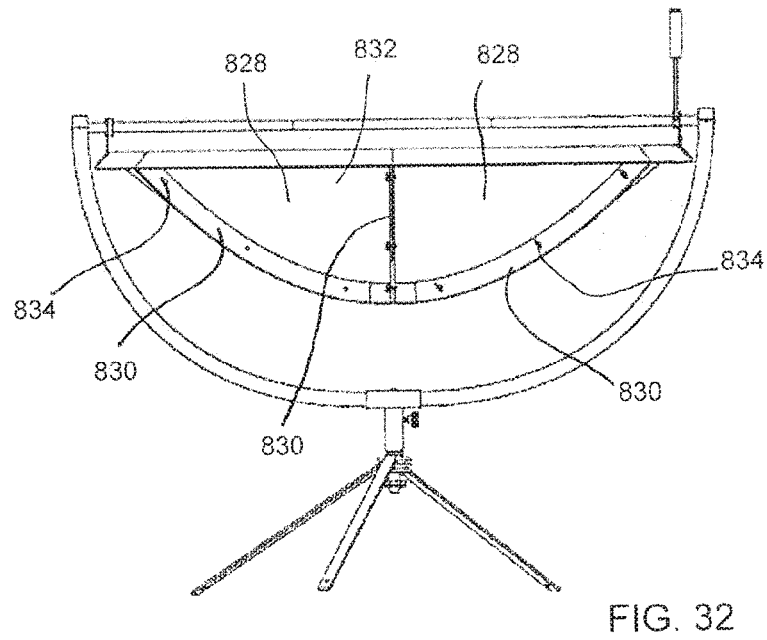
FIG. 32 is a schematic side view of a solar concentrator assembly in accordance with an embodiment of the invention.
Figure 33:
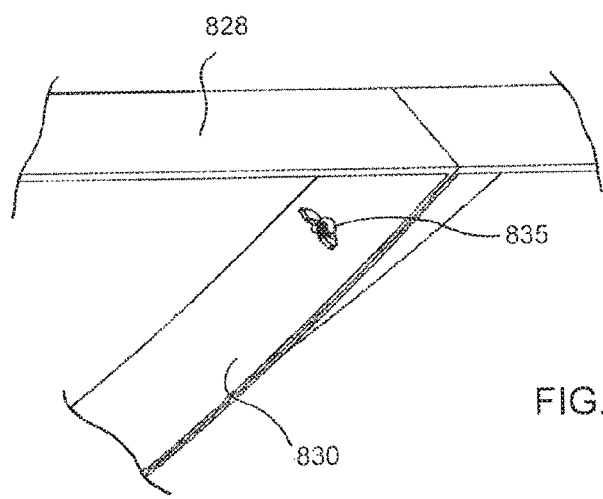
FIG. 33 is a schematic partial side view of a rigid panel in accordance with an embodiment of the invention.

In an embodiment depicted in FIGS. 32 and 33, the rigid dish 804 includes a plurality of rigid panels 828. Side walls 830 extend from a bottom surface 832 at a perimeter of each rigid panel 828. The side walls 830 provide rigid support for panels 828 and allow the panels 828 to be joined together to form the rigid dish 804. For example, as depicted, the side walls 830 of adjacent rigid panels 828 may include wall holes 834 to allow the rigid panels 828 to be secured together using a wingnut 835. Additional fasteners, such as screws, nuts, clips, clamps, snaps, ties, and/or adhesives may be used. For example, plastic snaps may be integrated into the rigid panels 828, and/or temporary or permanent ties may be used.

Rigid panels 828 may be made of any suitable materials that are sufficiently rigid, lightweight, corrosion resistant, and reflective. For example, the rigid panels 828 may be vacuum formed or injection molded plastic panels or stamped or die formed sheet metal. A top surface 836 of the panels 828 includes a reflective layer or coating. For example the top surface 836 may be (i) metalized using vacuum deposition, (ii) electroplated using a transparent conductive layer, and/or (iii) laminated or molded to a metalized MYLAR® (PET) film or metal (e.g. aluminum) foil. In addition, the panels 828 may be coated with a layer of acrylic or other protective polymer to, for example, provide corrosion resistance, scratch resistance, and/or UV resistance.

Figure 34:
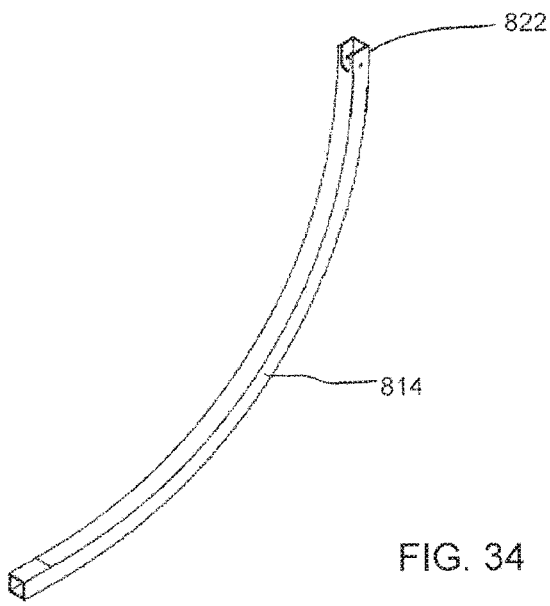
FIG. 34 is a schematic perspective view of a curved support member in accordance with an embodiment of the invention.
Figure 35:
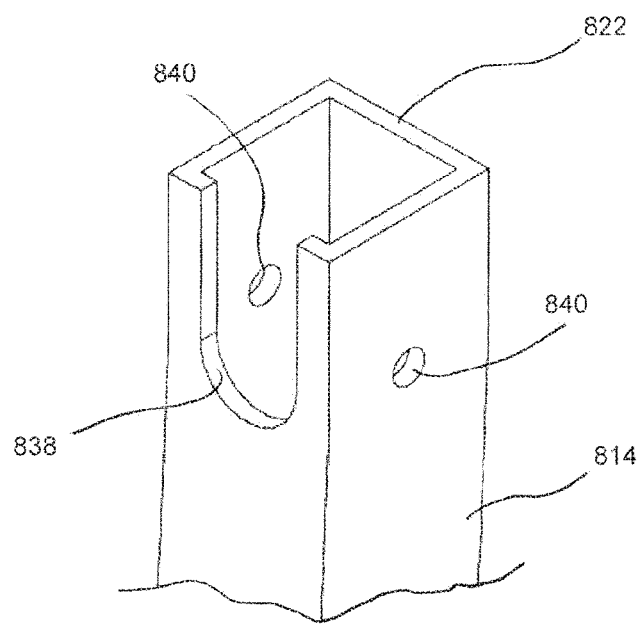
FIG. 35 is a schematic perspective partial view of a distal end of a curved support member in accordance with an embodiment of the invention.
Figure 36:
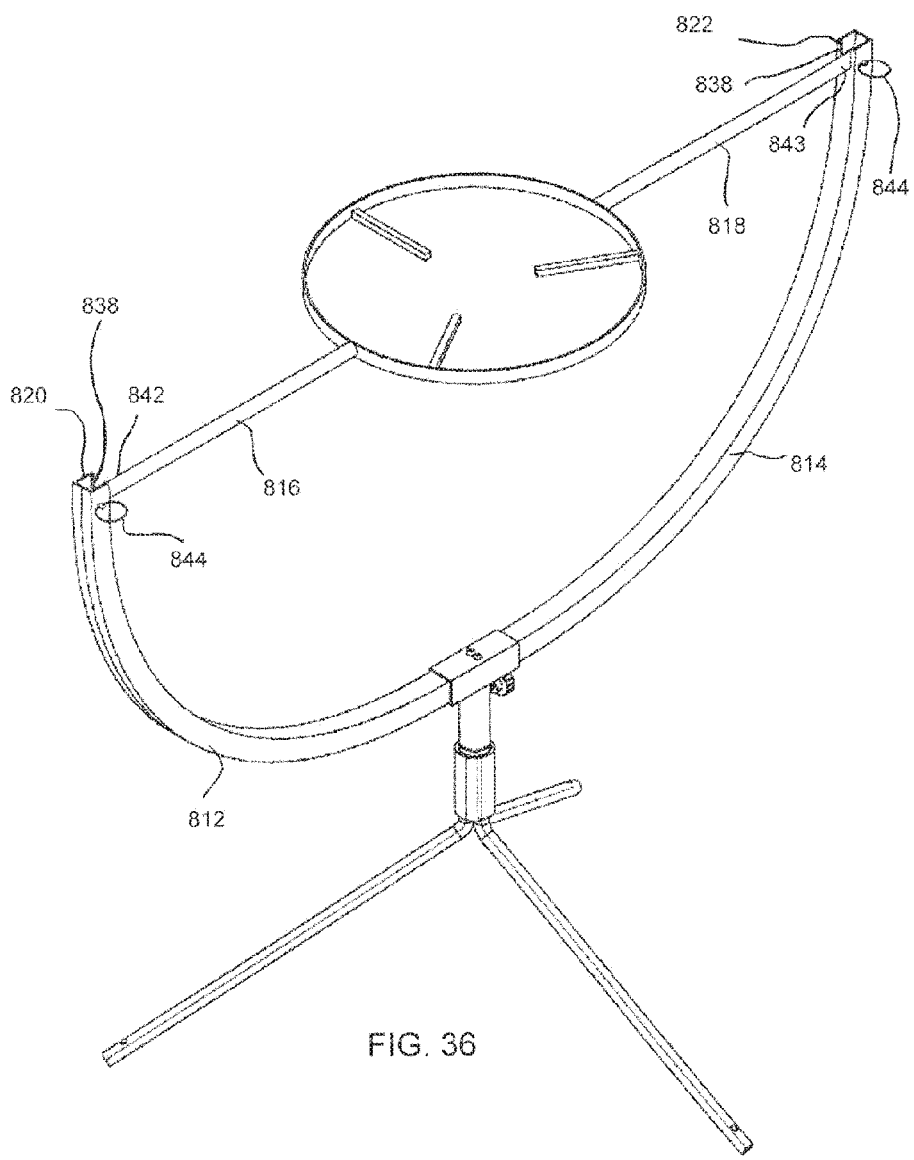
FIG. 36 is a schematic perspective view of a stand and a pot stand in accordance with an embodiment of the invention.

Referring to FIGS. 34, 35, and 36, the distal ends 820, 822 of curved support members 812, 814 may include a notch 838 and through-hole 840 to support and attach the hanging shafts 816, 818. As depicted in FIG. 36, outer ends 842, 843 of the hanging shafts 816, 818 pass through and are supported by the notch 838 in each curved support member 812, 814. The outer ends 842, 843 include a hole or opening to allow the hanging shafts 816, 818 to be secured to the curved support members 812, 814 using, for example, linchpins 844. The linchpins 844 or other mechanical fastener prevent the hanging shafts 816, 818 from rotating about their central axes.

Figure 37:
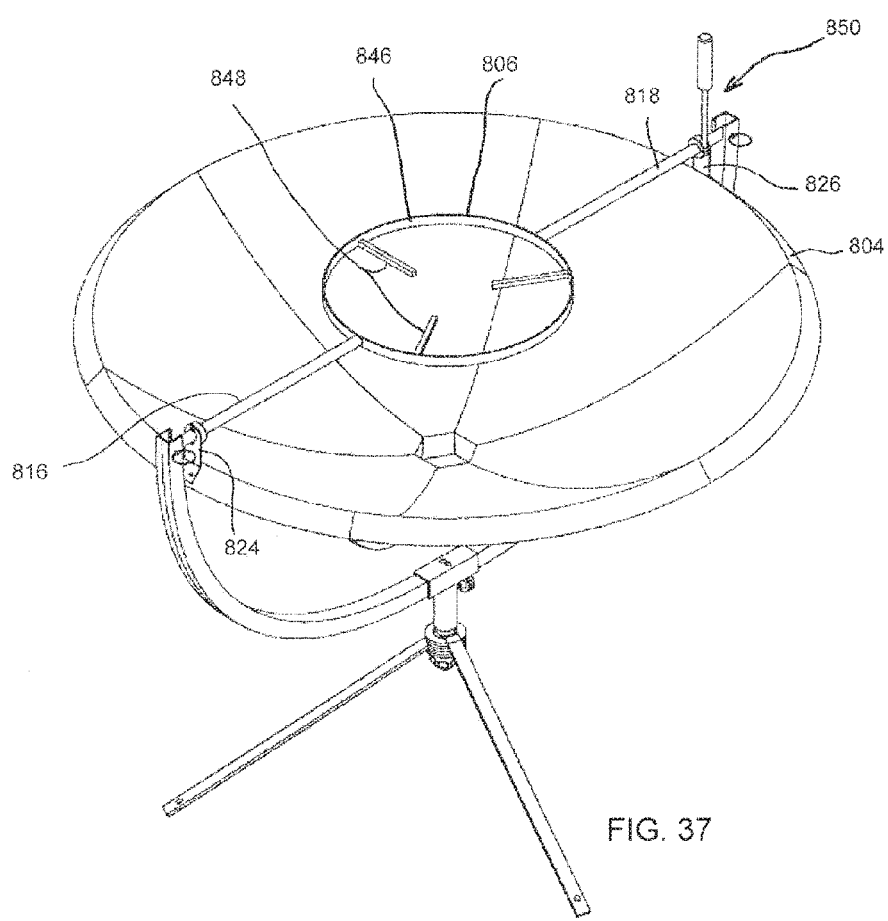
FIG. 37 is a schematic perspective view of a solar concentrator assembly in accordance with an embodiment of the invention.

Referring to FIG. 37, in one embodiment, the pot stand 806 includes a rim 846 and spokes 848. As depicted, the rim 846 may be circular and the spokes 848 may extend toward a center of the rim 846 in a radial direction. In other embodiments, the rim 846 may be any shape, such as square, rectangular, triangular, or oval. In addition, while the spokes 848 are depicted as being shorter than a radius of the rim 846, the spokes 848 may also have a length equal to or greater than the radius of the rim 846. As discussed above, the pot stand 806 may be used to support a container of water, such as a kettle, pot, or pan. The pot stand 806 may also be used to support the thermoelectric module 600 and/or the heat transfer module 700, described above.

Figure 38:
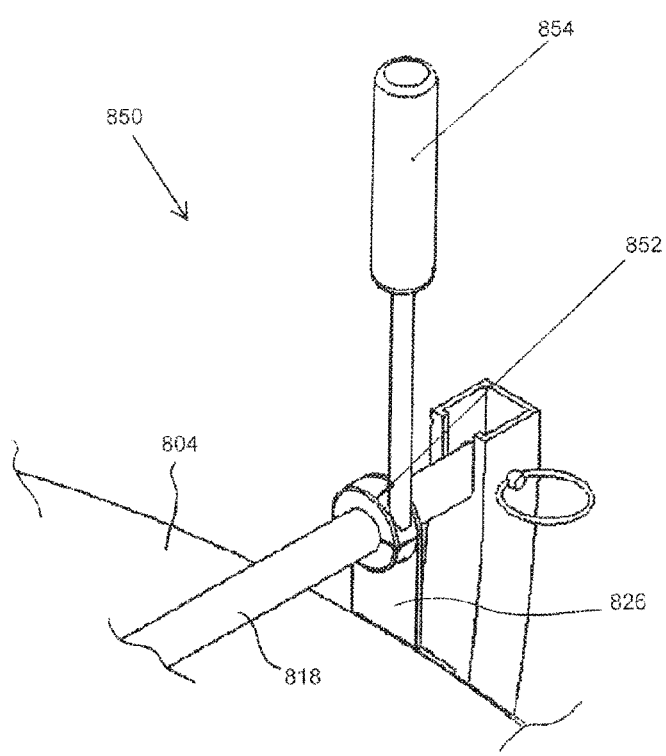
FIG. 38 is a schematic perspective partial view of a hanging assembly in accordance with an embodiment of the invention.

FIGS. 37 and 38 depict an embodiment of a hanging assembly 850 for the rigid dish 804. The hanging assembly 850 includes the hanging shafts 816, 818, the hangers 824, 826, a locking collar 852, and a clamp handle 854. As depicted, the hanging shaft 818 passes through the center of the locking collar 852. The hanger 826 is attached to the locking collar 852, and the rigid dish 804 is suspended from the locking collar 852 using the hangers 824, 826.

The angular position of the locking collar 852 may be adjusted using the clamp handle 854. For example, the locking collar 852 may be a split collar and the clamp handle 854 may include a threaded end. By rotating the clamp handle 854 about its central axis, the two halves of the split collar may be moved apart to loosen the locking collar 852 so that it is free to rotate around the hanging shaft 818. With the locking collar 852 loose, the locking collar 852, the hangers 824, 826, and the rigid dish 804 may be rotated about the center axis of the hanging shafts 816, 818 by pushing or pulling on the clamp handle 854. This allows the rigid dish 804 to be tilted at a desired angle with respect to the horizon (i.e., altitude). Once the rigid dish 804 is at the desired angle, the locking collar 852 may be tightened on the hanging shaft 818 by again rotating the clamp handle 854 about its central axis. With the locking collar 852 secured to the hanging shaft 818, the angle or altitude of the rigid dish 804 may be fixed. In other embodiments, the altitude of the rigid dish 804 is fixed using a set screw that passes, for example, through a collar and into contact with the hanging shaft 818.

Figure 39A:
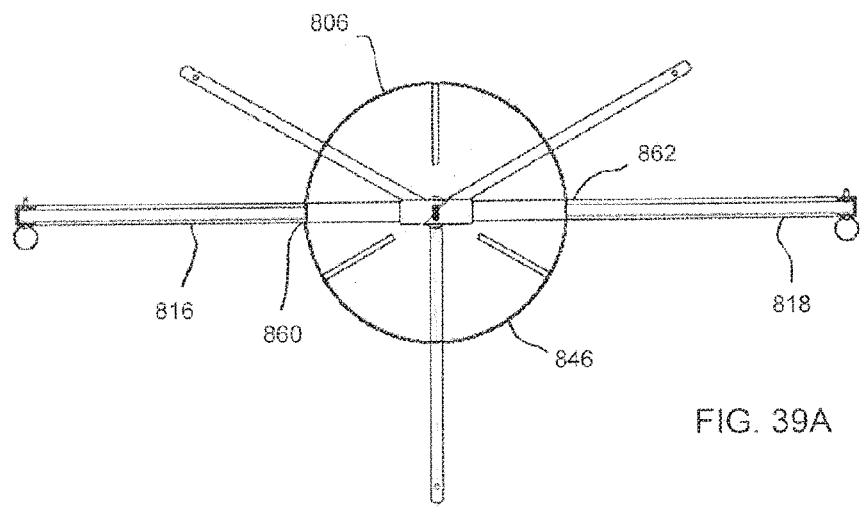
FIG. 39a is a schematic top view of a stand and a pot stand in accordance with an embodiment of the invention.
Figure 39B:
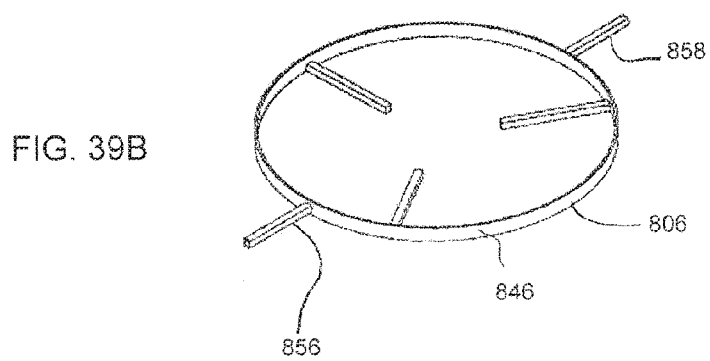
FIG. 39b is a schematic perspective view of a pot stand in accordance with an embodiment of the invention.
Figure 39C:
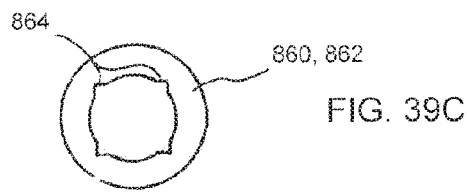
FIG. 39c is a schematic end view of a hanging shaft in accordance with an embodiment of the invention.
Figure 40:
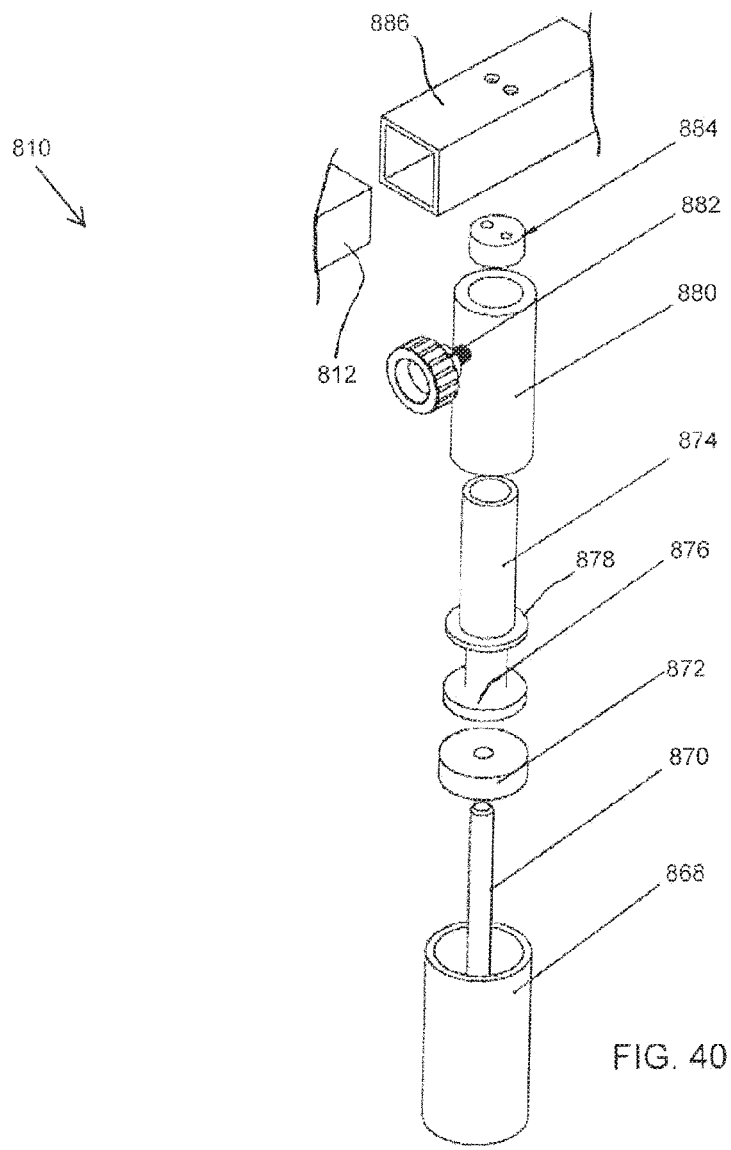
FIG. 40 is a schematic perspective exploded view of a vertical support assembly in accordance with an embodiment of the invention.
Figure 41:
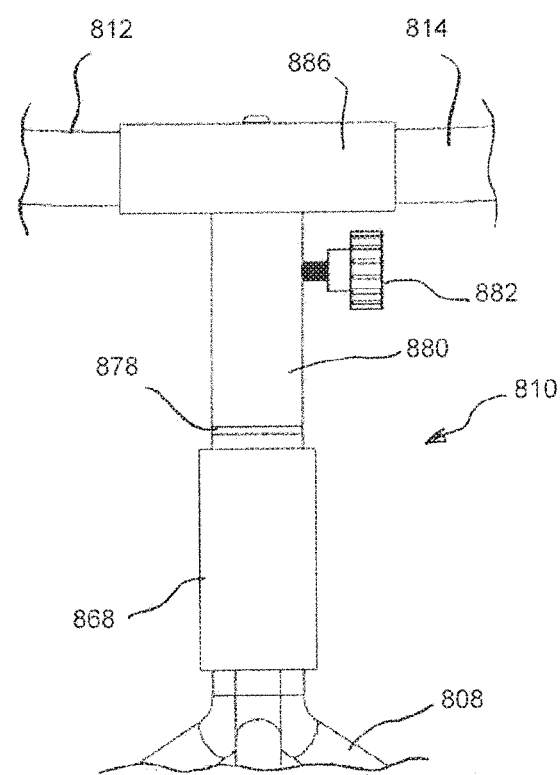
FIG. 41 is a schematic front view of a vertical support assembly in accordance with an embodiment of the invention.
Figure 42:
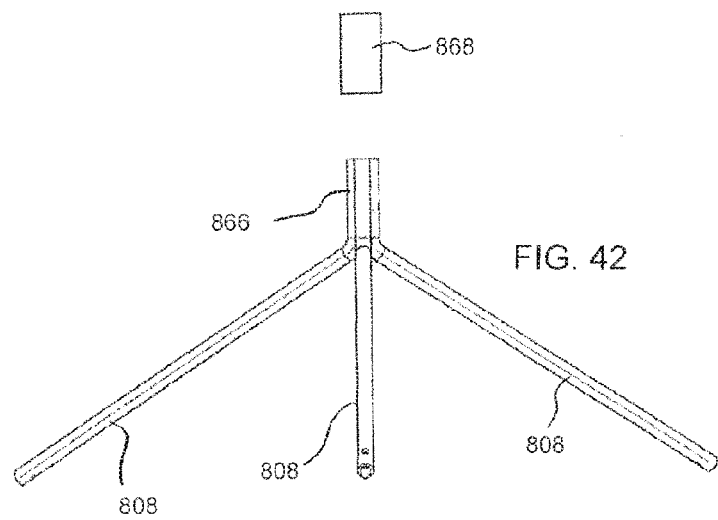
FIG. 42 is a schematic front view of a leg tube and legs in accordance with an embodiment of the invention.
Figure 43:
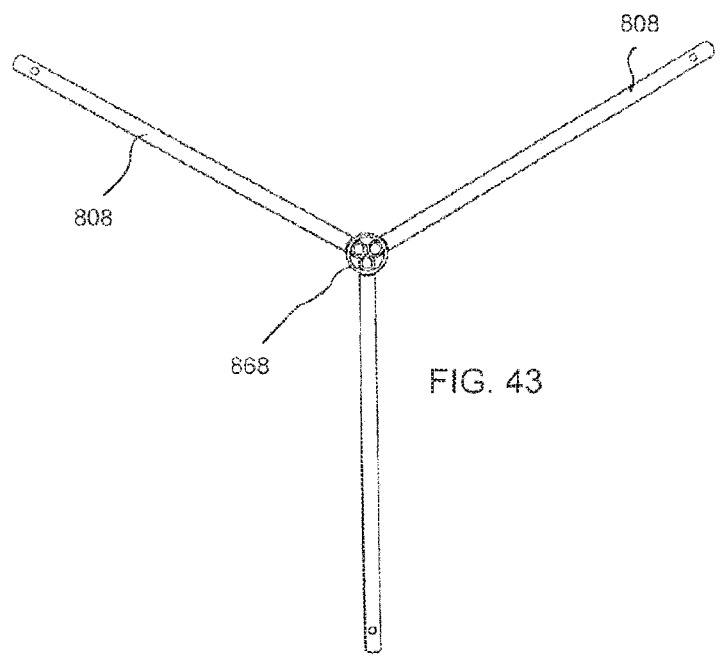
FIG. 43 is a schematic top view of a leg tube and legs in accordance with an embodiment of the invention.

Referring to FIGS. 39a, 39b, and 39c, to attach the pot stand 806 to the hanging shafts 816, 818, the pot stand 806 may include stubs 856, 858 that extend from the rim 846 into hollow ends 860, 862 of the hanging shafts 816, 818. To prevent rotation of the pot stand 806 with respect to the hanging shafts 816, 818, a cross-section of the stubs 856, 858 may not be round. For example, the cross-section of the stubs 856, 858 may be rectangular, triangular, star-shaped, or, as depicted in FIG. 39b, square. To provide the desired fit, an interior surface of the hollow ends 860, 862 is adapted to receive the stubs 856, 858 and prevent rotation of the stubs 856, 858, with respect to the hanging shafts 816, 818, once received therein. For example, as depicted in FIG. 39c, an interior surface of the hollow ends 860, 862 may include stub notches 864 to accommodate corners of the square stubs 856, 858.

Referring to FIGS. 40-43, an embodiment of the vertical support assembly 810 of the stand 802 attaches the legs 808 to the curved support members 812, 814. Top ends 866 of the legs 808 are housed within a leg tube 868. A threaded rod 870 extends upward from the center of the leg tube 868, through a lower disc 872 and into a hollow sleeve 874. The lower disc 872 may be attached to the leg tube 868 using, for example, a press-fit, adhesive, and/or welding. A base of the hollow sleeve 874 includes a support disc 876. The hollow sleeve 874 also includes a flange 878 positioned above the support disc 876. A top portion of the hollow sleeve 874 passes into a bushing 880. The bushing 880 includes a threaded hole to accommodate a threaded locking knob 882. An upper disc 884 is inserted into a top portion of the bushing 880. The upper disc 884 may be attached to the bushing 880 using, for example, a press-fit, adhesive, and/or welding. A hollow bar segment 886 is adapted to receive a lower end of the curved support members 812, 814 and is attached to the upper disc 884 using, for example, screws.

The components of the stand 802 may be made of any sufficiently rigid and corrosion resistant materials. For example, the leg tube 868, the lower disc 872, the bushing 880, and the upper disc 884 may be made of one or more metals, such as aluminum. The hollow sleeve 874, support disc 876, and flange 878 may be made of plastic. The hollow bar segment 886 and/or curved support members 812, 814 may be made of rigid plastic and/or aluminum.

To adjust the heading (e.g., north, south, east, or west) of the rigid dish 804, the rigid dish 804 may be rotated about a central support axis 888 (e.g., a vertical axis) of the vertical support assembly 810, with respect to the legs 808. Specifically, by loosening the threaded locking knob 882, the curved support members 812, 814 and rigid dish 804 are free to rotate about the central support axis 888. Once the desired heading has been obtained, further rotation of the rigid dish 804 about the central support axis 888 may be prevented by rotating the threaded locking knob 882 until it engages the hollow sleeve 874.

Figure 44:
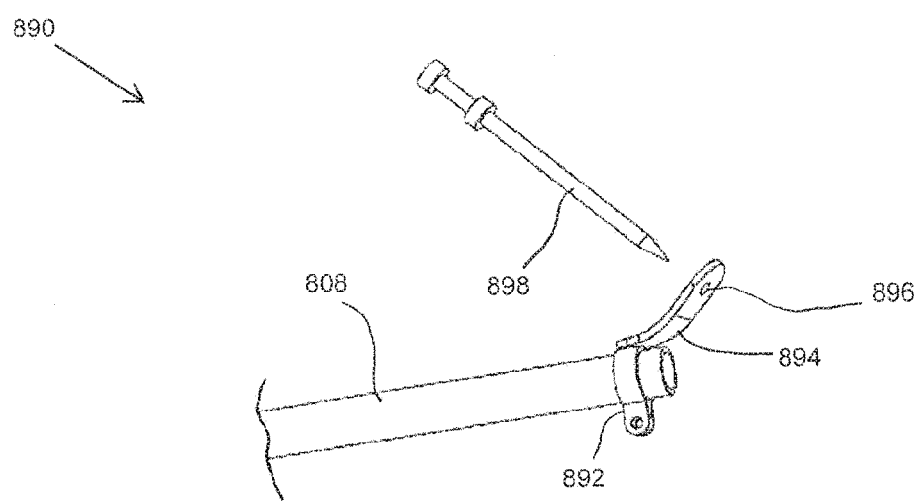
FIG. 44 is a schematic perspective view of a staking assembly in accordance with an embodiment of the invention.

Referring to FIG. 44, a staking assembly 890 is provided to anchor the legs 808 to the ground. In one embodiment, the staking assembly 890 includes a leg collar 892 attached to a bottom of a leg 808. A flexible strap 894 is attached to the leg collar 892 and includes a strap hole 896 at a distal end. A stake 898 may be passed through the strap hole 896 and driven into the ground. The leg collar 892 and stake 898 may be made of a rigid plastic and/or one or more metals, such as aluminum or stainless steel. The flexible strap 894 may be made of plastic and/or leather.

The stand 802 is lightweight, easy to assemble, and its components may be made of one or more metals, plastic, wood, and/or bamboo. As described above, the hanging assembly 850 and vertical support assembly 810 allow the altitude and heading of the rigid dish 804 to be adjusted and locked in place using an innovative tension-lock system. In certain embodiments, the stand 802 is used with the rigid dish 804 and/or the reflective dish module 400, including the pliable material 404.

Having described certain embodiments of the invention, it will be apparent to those of ordinary skill in the art that other embodiments incorporating the concepts disclosed herein may be used without departing from the spirit and scope of the invention. The described embodiments are to be considered in all respects as only illustrative and not restrictive.

What is claimed is:

1. A portable solar concentrator comprising:
a stand;
a shaft assembly supported by the stand, the shaft assembly comprising a centrally disposed target and two shafts extending from opposite ends of the target; and
a rigid dish suspended from the shafts of the shaft assembly, the rigid dish comprising a plurality of panels each having a reflective surface, wherein the panels are configured to direct solar energy at the target,
wherein the stand comprises first and second curved support members coupled to opposite ends of the shaft assembly, each support member coupled at a first end below the rigid dish to a vertical support of the stand and at a second end to an end of the shaft assembly.

2. The portable solar concentrator of claim 1, wherein the stand comprises a plurality of legs joined at the vertical support.

3. The portable solar concentrator of claim 1, wherein the target is configured to support a cooking vessel.

4. The portable solar concentrator of claim 1, wherein the panels are arranged to form a parabolic dish.

5. The portable solar concentrator of claim 1, wherein the rigid dish comprises at least five panels.

6. The portable solar concentrator of claim 1, wherein the panels are constructed of plastic or sheet metal.

7. The portable solar concentrator of claim 1, wherein the reflective surface comprises a metallic or polyester coating.

8. The portable solar concentrator of claim 1, wherein the rigid dish fixably rotates about a longitudinal axis of the shaft assembly.

9. The portable solar concentrator of claim 1, wherein the rigid dish fixably rotates about a vertical axis of the vertical support.

* * * * *